US010485137B2

United States Patent
Helsel et al.

(10) Patent No.: US 10,485,137 B2
(45) Date of Patent: Nov. 19, 2019

(54) COOLING DEVICE FOR FLUID SUBMERSION OF ELECTRONICS

(71) Applicant: Microsoft Technology Licensing, LLC, Redmond, WA (US)

(72) Inventors: Michael Rees Helsel, Seattle, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/446,396

(22) Filed: Mar. 1, 2017

(65) Prior Publication Data
US 2018/0255661 A1 Sep. 6, 2018

(51) Int. Cl.
*H05K 7/20* (2006.01)
*G06F 1/20* (2006.01)

(52) U.S. Cl.
CPC .......... *H05K 7/20236* (2013.01); *G06F 1/20* (2013.01); *H05K 7/20009* (2013.01); *H05K 7/20727* (2013.01); *H05K 7/20772* (2013.01); *G06F 2200/201* (2013.01)

(58) Field of Classification Search
CPC .......... H05K 7/20236; H05K 7/20763; H05K 7/203; H05K 7/20563; H05K 7/20636; H05K 7/20709; H05K 7/20737; H05K 7/20772; G06F 1/184
See application file for complete search history.

(56) References Cited

U.S. PATENT DOCUMENTS

| | | | | |
|---|---|---|---|---|
| 5,403,973 A | * | 4/1995 | Santilli | H05K 3/284 165/46 |
| 5,740,018 A | * | 4/1998 | Rumbut, Jr. | H05K 7/20563 165/46 |
| 7,450,384 B2 | * | 11/2008 | Tavassoli | H05K 7/20636 165/80.4 |
| 7,463,485 B1 | * | 12/2008 | Nishimura | H05K 7/20145 165/104.33 |

(Continued)

OTHER PUBLICATIONS

"The Carnotjet System", http://www.grcooling.com/carnotjet/, Retrieved on: Jan. 18, 2017, 5 pages.

(Continued)

*Primary Examiner* — Robert J Hoffberg
(74) *Attorney, Agent, or Firm* — Ogilvie Law Firm

(57) ABSTRACT

A cooled electronics module (CEM) includes a cooling device and a server blade or other electronic device that is operationally enclosed in a container of the cooling device by a closure secured to a connection block. Each CEM is pluggable for electronic communication and coolant fluid flow. The connection block has electronics connectors to connect the contained electronic device, which is submerged in coolant, with external networks, power, and other infrastructure. CEMs may be installed in an initial deployment of electronic devices, or later to rapidly replace or supplement an operating electronic device. Installation may include placing the CEM on a rail which has coolant lines and electrical lines and connectors, putting coolant in the CEM before or after placement, and making connections for power, data signal, and coolant flow. CEMs may be constrained as to the number of motherboards or volume or thermal energy per CEM pool of coolant.

20 Claims, 13 Drawing Sheets

(56) References Cited

U.S. PATENT DOCUMENTS

| | | | |
|---|---|---|---|
| 7,639,499 B1* | 12/2009 | Campbell | H05K 7/20772 165/104.19 |
| 7,787,248 B2 | 8/2010 | Campbell et al. | |
| 7,905,106 B2 | 3/2011 | Attlesey | |
| 7,911,793 B2* | 3/2011 | Attlesey | G06F 1/20 165/104.33 |
| 7,961,475 B2* | 6/2011 | Campbell | H05K 7/20772 165/80.4 |
| 8,081,478 B1 | 12/2011 | Drexler et al. | |
| 8,089,764 B2* | 1/2012 | Attlesey | G06F 1/20 165/104.33 |
| 8,089,765 B2* | 1/2012 | Attlesey | G06F 1/20 165/104.19 |
| 8,184,436 B2* | 5/2012 | Campbell | H05K 7/20809 165/104.21 |
| 8,467,189 B2* | 6/2013 | Attlesey | G06F 1/20 165/80.4 |
| 8,654,529 B2* | 2/2014 | Attlesey | G06F 1/20 165/80.3 |
| 9,049,800 B2 | 6/2015 | Shelnutt et al. | |
| 9,086,859 B2* | 7/2015 | Attlesey | G06F 1/20 |
| 9,128,681 B2* | 9/2015 | Attlesey | G06F 1/20 |
| 9,176,547 B2 | 11/2015 | Attlesey | |
| 9,223,360 B2* | 12/2015 | Attlesey | G06F 1/20 |
| 9,258,926 B2* | 2/2016 | Smith | H05K 7/20818 |
| 9,451,726 B2 | 9/2016 | Regimbal et al. | |
| 9,464,854 B2 | 10/2016 | Shelnutt et al. | |
| 9,781,862 B2 | 10/2017 | Kolstad et al. | |
| 10,188,017 B2* | 1/2019 | Gauthier | H05K 7/20781 |
| 10,204,659 B1* | 2/2019 | Keehn | G11B 33/122 |
| 2007/0034360 A1 | 2/2007 | Hall | |
| 2007/0133171 A1* | 6/2007 | Cheon | H05K 7/20636 361/699 |
| 2007/0199340 A1* | 8/2007 | Knight | H05K 7/1425 62/259.2 |
| 2008/0273303 A1 | 11/2008 | Pal | |
| 2010/0101759 A1* | 4/2010 | Campbell | H05K 7/20772 165/80.4 |
| 2010/0101765 A1* | 4/2010 | Campbell | H05K 7/20809 165/104.33 |
| 2011/0132579 A1 | 6/2011 | Best et al. | |
| 2011/0187188 A1* | 8/2011 | Yang | H02M 7/04 307/31 |
| 2011/0268410 A1* | 11/2011 | Giraud | G02B 6/4452 385/135 |
| 2011/0317367 A1* | 12/2011 | Campbell | H05K 7/20809 361/700 |
| 2012/0173444 A1* | 7/2012 | Zik | G06Q 10/10 705/317 |
| 2013/0081790 A1 | 4/2013 | Tufty et al. | |
| 2013/0083479 A1 | 4/2013 | Tufty et al. | |
| 2014/0216686 A1 | 8/2014 | Shelnutt et al. | |
| 2014/0218859 A1* | 8/2014 | Shelnutt | G06F 1/206 361/679.46 |
| 2014/0301037 A1 | 10/2014 | Best | |
| 2015/0146368 A1* | 5/2015 | Shafer | H05K 7/20236 361/679.53 |
| 2015/0257301 A1* | 9/2015 | Morgan | H05K 7/1425 361/802 |
| 2015/0336053 A1 | 11/2015 | Dow et al. | |
| 2015/0382511 A1 | 12/2015 | James et al. | |
| 2015/0382515 A1 | 12/2015 | James et al. | |
| 2016/0095253 A1 | 3/2016 | Tufty et al. | |
| 2016/0165748 A1 | 6/2016 | Chen | |
| 2016/0238266 A1* | 8/2016 | O'Donnell | F24F 11/001 |
| 2016/0301344 A1* | 10/2016 | Pepe | H02P 9/04 |
| 2016/0324033 A1 | 11/2016 | Shafer et al. | |
| 2016/0360649 A1* | 12/2016 | Regimbal | H05K 7/20236 |
| 2017/0064862 A1* | 3/2017 | Miyoshi | H05K 7/203 |
| 2017/0145573 A1 | 5/2017 | Mcwhinney et al. | |
| 2017/0150649 A1* | 5/2017 | Chester | H05K 7/20281 |
| 2017/0156233 A1* | 6/2017 | Moss | H05K 7/20818 |
| 2017/0181325 A1* | 6/2017 | Shelnutt | H05K 7/20781 |
| 2017/0181329 A1* | 6/2017 | Shelnutt | H05K 7/20836 |
| 2017/0320019 A1 | 11/2017 | Doyen et al. | |
| 2017/0325358 A1* | 11/2017 | Franz | H05K 7/20236 |
| 2017/0350625 A1* | 12/2017 | Burns | F25B 13/00 |
| 2018/0135235 A1* | 5/2018 | Yu | D06F 58/28 |

OTHER PUBLICATIONS

Bigelow, Stephen J., "Liquid immersion cooling relief for ultra-dense data centers", http://searchdatacenter.techtarget.com/feature/Liquid-immersion-cooling-relief-for-ultra-dense-data-centers, Published on: Oct. 2014, 5 pages.

Rich Miller, "Iceotope Gets $10 Million Funding, Partners With Schneider", retrieved from <<http://www.datacenterknowledge.com/archives/2014/01/14/iceotope-gets-10-million-funding-partners-schneider/>>, Jan. 14, 2014, 3 pages.

Rich Miller, "Intel Embraces Submerging Servers in Oil", retrieved from <<http://www.datacenterknowledge.com/archives/2012/09/04/intel-explores-mineral-oil-cooling/>>, Sep. 4, 2012, 5 pages.

"FAQ | Iceotope", retrieved from <<http://www.iceotope.com/faq/>>, copyright 2016, 5 pages.

"MB-49-L06 Water Block (Motherboard)", retrieved from <<http://koolance.com/index.php?route=product/product&product_id=470>>, Apr. 4, 2007, 2 pages.

"Liquid dielectric", retrieved from <<https://en.wikipedia.org/wiki/Liquid_dielectric>>, Jan. 19, 2017, 3 pages.

"Products—LiquidCool Solutions", retrieved from <<http://www.liquidcoolsolutions.com/products/>>, copyright 2009, 7 pages.

Satish C. Mahapatra, "An Overview of Liquid Coolants for Electronics Cooling", retrieved from <<https://www.electronics-cooling.com/2006/05/an-overview-of-liquid-coolants-for-electronics-cooling/>>, May 1, 2006, 10 pages.

"Quick couplings", retrieved from <<http://www.staubli.com/en/connectors/quick-couplings/>>, no later than Jan. 30, 2017, 2 pages.

"Ex-parte Quayle Action Issued in U.S. Appl. No. 15/610,157", Mailed Date: Apr. 2, 2018, 10 Pages.

Al-Anil, et al., "Effect of Processor Layout on the Thermal Performance of Fully Immersed Liquid-Cooled Microelectronics", In the Proceedings of 14th International Conference on Simulation and Experiments in Heat Transfer and its Applications, Sep. 7, 2016, 12 Pages.

"Ex-parte Quale Action Issued in U.S. Appl. No. 15/610,157", Mailed Date Apr. 2, 2018, 9 Pages.

\* cited by examiner

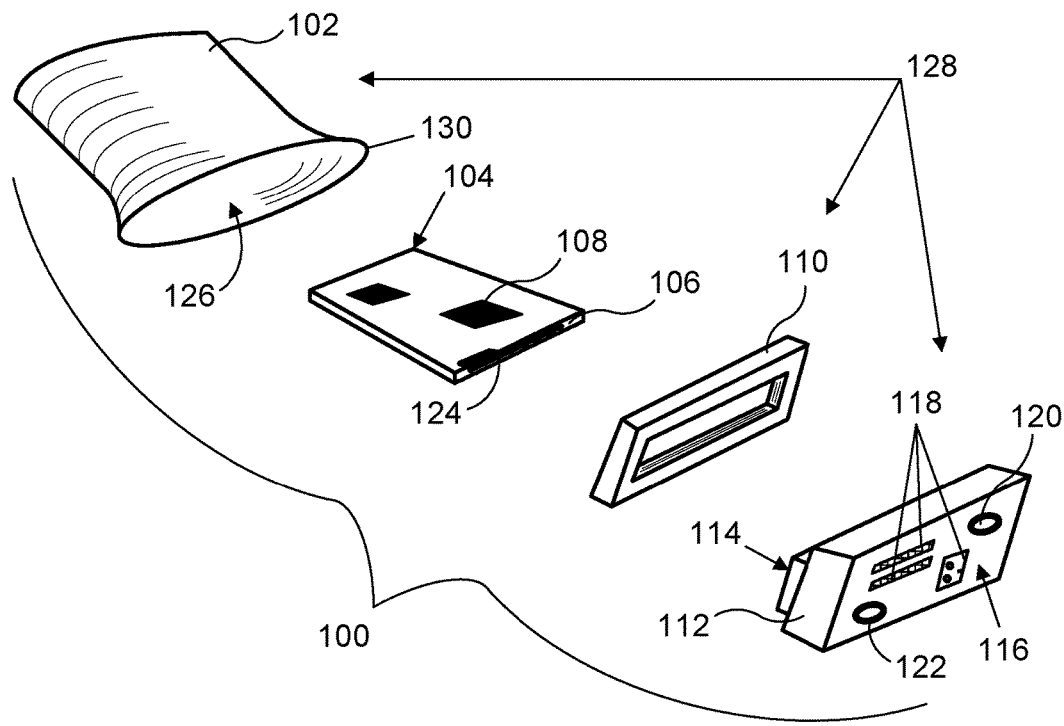
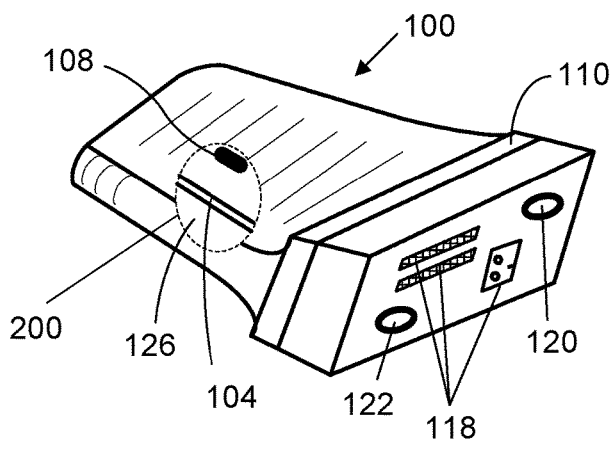
Fig. 2
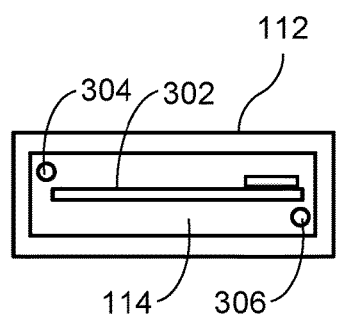
Fig. 3

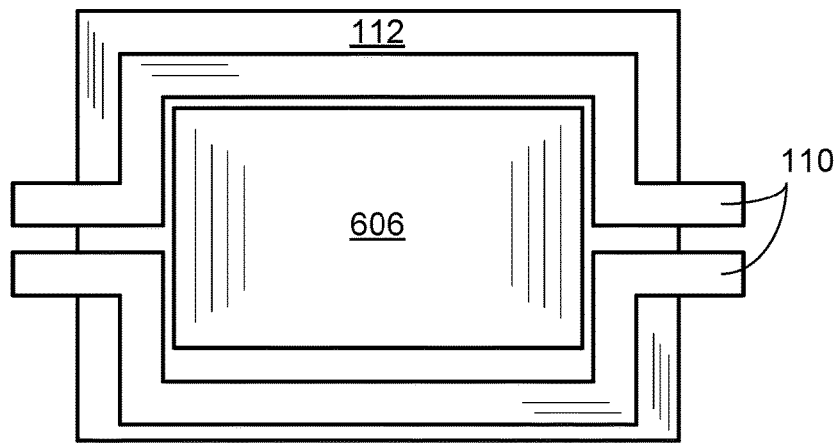
Fig. 8
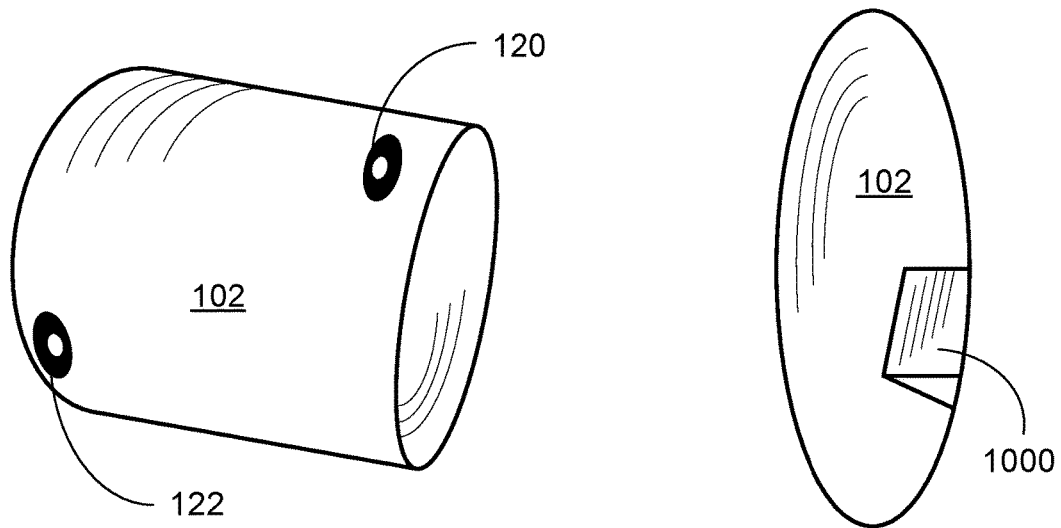
Fig. 9
Fig. 10

EXAMPLE THREE OF INITIAL DEPLOYMENT: FLOW CHART 1600

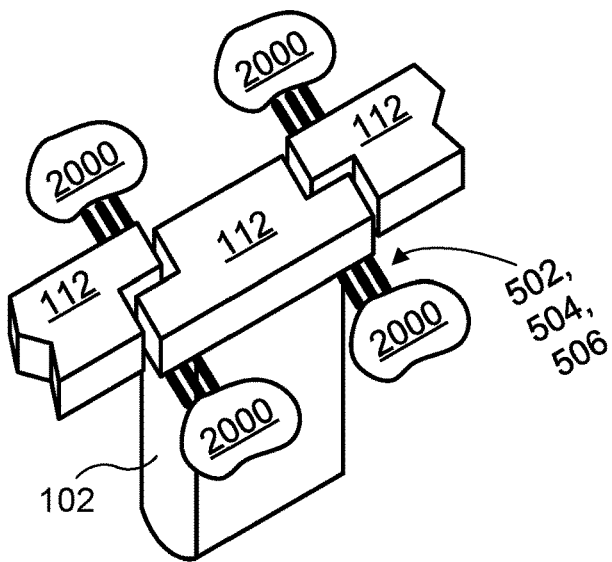
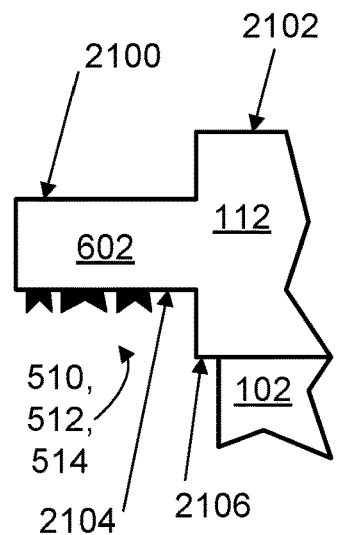
Fig. 20
Fig. 21
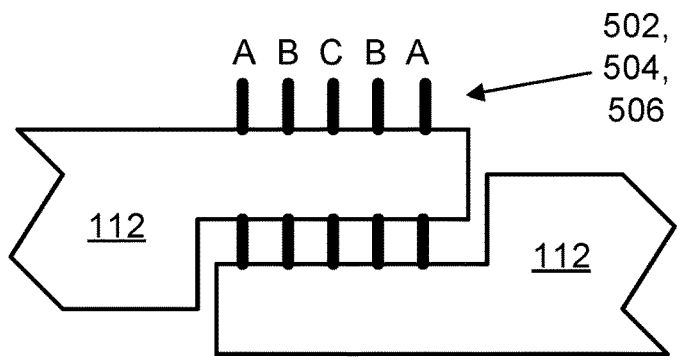
Fig. 22
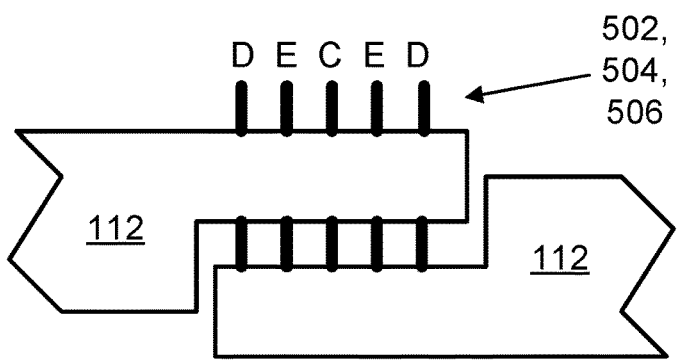
Fig. 23

COOLING DEVICE FOR FLUID SUBMERSION OF ELECTRONICS

BACKGROUND

Datacenters, factories, research facilities, educational facilities, and other facilities which contain electronic devices provide electrical power to those devices. Much of that electric power is consumed by operation of the electronic devices and thereby transformed into computational results. But a portion of the power is transformed into heat. Each electronic device has an operational temperature range. An electronic device will become unreliable or fail completely at some point if it is exposed to environmental temperatures outside of its operational temperature range. Accordingly, measures are taken to transfer heat away from electronic devices. Cooling systems already use a wide variety of designs and mechanisms to transfer heat. However, improvements are possible.

SUMMARY

Some technologies described herein are directed to the technical activity of transferring heat away from one or more electronic devices by using fluid flow to remove heat. Some of the technologies herein are directed to improving options for cooling by providing relatively light weight and low cost cooling devices which support coolant fluid flow that carries heat away from electronic devices that are submerged in the coolant fluid. Some technologies are tailored to initial deployment of cooling devices in a facility, and some are tailored to rapid supplementation or replacement of individual cooling devices and their cooled electronics. Some technologies described herein are directed to cooled electronics modules (CEMs). Each CEM includes a cooling device and a server blade or other electronic device that is operationally enclosed in a container of the cooling device, and each CEM is pluggable for electronic communication and coolant fluid flow. Other technical activities pertinent to teachings herein will also become apparent to those of skill in the art.

Some embodiments use or provide a cooling device for fluid submersion of electronics. The cooling device has a coolant container that encloses at least a portion of a coolant space. A connection block is mechanically attachable to the coolant container. The connection block has a coolant-space-facing surface and an environment-facing surface, with an internal electronics connector on the coolant-space-facing surface and an external electronics connector on the environment-facing surface. The external electronics connector is electrically connected to the internal electronics connector. A coolant input has a valved inlet to the coolant space, and a coolant output has a valved outlet from the coolant space. A closure is operable to seal a volume of a coolant and an electronics device in the coolant space inside the coolant container, with at least a portion of the electronics device submerged in the coolant and the electronics device mechanically and electrically connected to the internal electronics connector.

Some embodiments use or provide a method of cooling device installation. This includes obtaining a cooling device which includes a coolant container that encloses at least a portion of a coolant space and at least a portion of an electronics device. The obtained cooling device also includes a connection block that is mechanically attachable to the coolant container. The connection block has a coolant-space-facing surface and an environment-facing surface, with an external electronics connector on the environment-facing surface. The external electronics connector is electrically connected to the electronics device. The cooling device also includes a coolant input with an inlet to the coolant space and a coolant output with an outlet from the coolant space. The cooling device connection block is placed on at least one rail, and at least one of the following is connected to the external electronics connector: a power connector, a data signal connector. Coolant is put into the coolant space until the electronics device is substantially submerged in the coolant, and then the coolant container is closed, thereby separating the coolant space from an environment around the cooling device.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

FIG. 1 is an exploded perspective view of a cooled electronics module (CEM) showing a cooling device container, an electronic device, a cooling device container closure, and a cooling device connection block;

FIG. 2 is a perspective view of the FIG. 1 cooled electronics module after it is assembled, with a cutaway showing the electronic device inside the closed container;

FIG. 3 is a view of a coolant-space-facing side of the cooling device connection block of FIG. 1;

FIG. 8 is a view of a coolant-space-facing side of a cooling device connection block and a two-piece closure;

FIG. 9 is a perspective view of a coolant container having a coolant input and a coolant outlet in the sides of the container, as opposed to having one or both coolant flow paths go through a cooling device connection block;

FIG. 10 is a top view of a coolant container showing a vane attached to the coolant container for directing coolant flow;

FIG. 20 an exploded perspective view showing at least a portion of each of three cooled electronics modules in a packed layout;

FIG. 21 is a side view showing a connection block extension having a wing configuration; and FIGS. 22 and 23 are top views of connection block extensions showing two of the many possible fluid and electrical line arrangements.

DETAILED DESCRIPTION

Overview

Figure 4:
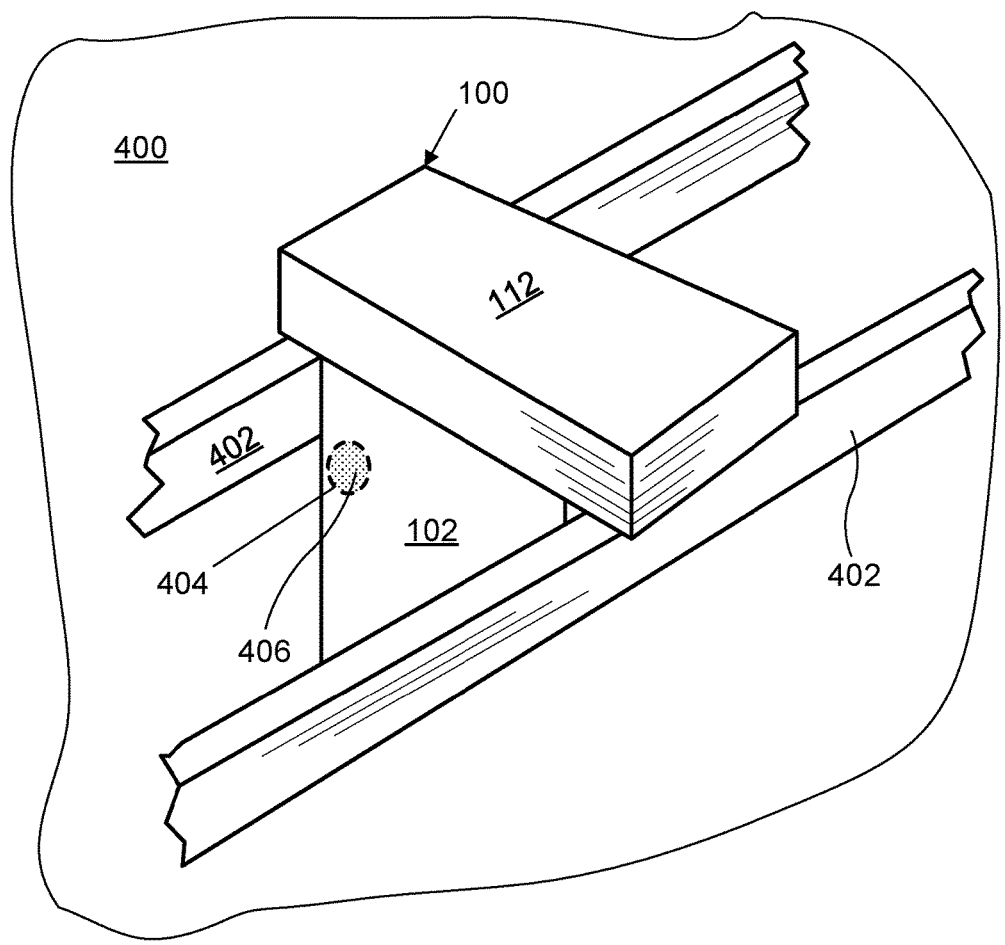
FIG. 4 is a perspective view of an assembled cooled electronics module hanging on a pair of rails, with a cutaway showing coolant inside a closed container of the module.

Computer data centers, server rooms, and other facilities that operate anywhere from dozens to thousands of servers or other electronic devices must provide cooling somehow to prevent failure of those electronic devices due to overheating. For present purposes, a given cooling approach can be viewed as belonging to one or more of three general categories: natural cooling, air cooling, and liquid cooling. Natural cooling involves locating the facility in a cool environment, such as the Arctic, or a mountaintop, for example. Air cooling involves allowing, encouraging, or forcing relatively cool air to move over the electronics or over something that is thermally connected to them, such as a heat sink, to carry heat away from the electronics. Liquid cooling involves allowing, encouraging, or forcing one or more relatively cool liquids to move over the electronics, or over something that is thermally connected to them, to carry heat away from the electronics.

Each cooling approach has relative advantages and disadvantages. For example, natural cooling has a low power cost but is often unreliable and lacking in sufficient cooling capacity, e.g., for facilities which contain tens of thousands of servers. Air cooling can be very reliable, but requires cooling fans, vents, and other infrastructure, and electricity to power the fans. Air cooling also tends to cool things (and people) that did not need to be cooled. Liquid cooling is more narrowly targeted at the electronic devices that need to be cooled, but requires a plumbed infrastructure as well as pumps to move the coolant, and introduces a coolant liquid which may cause damage if it leaks. A cost benefit analysis of cooling options may be complicated by factors such as geographic and legal constraints on facility location, environmental protection constraints, mechanical compatibility of electronic devices with a particular cooling approach, the difficulty of retrofitting or upgrading an existing facility to change the cooling technology used, and so on. The cooling options presented here are merely that—options to be considered. They are not universal solutions, but they do provide relatively low weight, low cost liquid cooling solutions that are worthy of consideration.

Some examples described herein provide or a use a light weight, low cost approach to contain cooling liquid, in a submersion cooling scenario for electronics. This approach allows the electronics to access electrical and network connections without disturbing the cooling environment. In some cases, the server/computer equipment is designed with a connection block containing all the infrastructure computing connections, including cooling liquid inlets and outlets, which may be placed on one or more sides of the assembled cooling device. A flexible membrane bag will surround the server electronics on all sides, except the connection block side, to which the bag will be attached. The connection block will have either a mechanical sealing or heat sealing closure connection which closes the bag where the bag attaches to the coolant-facing side of the connection block. Cooling liquid can be pumped in and out of the bag in a closed loop system, and can kept at low-pressure (that is, less than the ambient atmospheric pressure). Dividers on the electronics can be used to divert coolant liquid flow.

Features of the disclosed innovations can be selectively used, and can be combined in various ways. Some of these features are highlighted in the following numbered examples:

Overview Example #1. A fluid-impermeable coolant container. The coolant container may be a flexible container such as a bag, may be semi-flexible such as a partial bag with a mix of rigid and flexible sides, or may be fully rigid. The coolant container may be used for fluid cooling a computer motherboard, for example. The container and server may be connected prior to installation, prior to connection to power, network, and external peripherals, and prior to filling the coolant container with the cooling fluid.

Overview Example #2. Vertical configuration. In some examples the coolant container includes a bag that is hung vertically on one or more rails, with the bag's opening at the top of the bag. Sealing the bag is not necessarily required in this case, depending on the particular embodiment, but it is expected that in many cases the bag will be sealed to reduce spillage, to permit pressurized flow, or both.

Overview Example #3. As in example #1, with the connection block having a sealing surface to seal the fluid inside the flexible membrane of the bag. In some cases, the connection block includes an internal electronics connector and an external electrical power connection allowing the contained electronics to receive power from outside the bag. In some cases, which may overlap those just noted, the connection block has at least one external communication port, such as a network port, Serial-Attached-SCSI (SAS), Infiniband® connector (mark of Infiniband Trade Association), an external PCIe connector, an optical connection, laser connectivity, or a line-of-sight optical connection, to name a few of the many possible electronic connectors, for connecting the contained electronics to a corresponding peripheral, network, or storage device that is located outside the coolant container bag.

Overview Example #3. This includes a combination of features from examples #1, #2, and #3, with a vertically hung sealed bag and electrical connectivity between the bag-enclosed electronics and one or more external electrical lines.

Overview Example #4. This includes a combination of features from examples #1 and #3, with the coolant container installed horizontally. In this case, the coolant container is at least partially rigid, e.g., the container may be rigid on a bottom layer, or rigid on a lower one inch section of the bag. In some variations, the cooling container has an oblique orientation instead of a vertical or horizontal orientation.

Overview Example #5. This includes a combination of features from examples from any of #2 through #5 above, where hanging the bag onto the rails causes a connection to at least one of the following through the rails: (a) electrical power which is either ground or neutral, or both, (b) electrical power which is hot (may be any phase if the power provided is multi-phase), (c) a cooling liquid inlet, (d) a cooling liquid outlet.

In contrast with some existing liquid cooling techniques, some embodiments described herein can be stacked while reducing or minimizing the amount of liquid (and thus optimizing weight) in the rack that contains the coolant devices and electronics on rails or other support structures. Also in contrast with some existing techniques, some embodiments described herein can be moved, installed, and uninstalled more easily. The empty bag is relatively light, e.g., it may be less than ten percent of the weight of the coolant-filled bag and coolant. Also, connectors remain accessible after some embodiments are placed onto rails or installed into a rack, unlike some existing liquid cooling approaches.

The technical character of embodiments described herein will be apparent to one of ordinary skill in the art, and will also be apparent in several ways to a wide range of attentive readers. For instance, some embodiments address technical activities that are rooted in electronics technology, such as installing electronics cooling devices, and cooling electronic devices without damaging them. Moreover, technical effects and advantages provided by some embodiments include a reduction in the weight of coolant modules, a relatively rapid supplementation or replacement of liquid cooled electronics, and single-opening unitary coolant containers having a decreased manufacturing cost and an increased reliability relative to double-opening or multi-piece coolant containers. Other advantages will also be apparent to one of skill from the description provided.

ACRONYMS AND ABBREVIATIONS

Some acronyms and abbreviations are defined below. Others may be defined elsewhere herein or require no definition to be understood by one of skill.

ALU: arithmetic and logic unit
BIOS: Basic Input/Output Software
BTU: British Thermal Units
CEM: cooled electronics module
CPU: central processing unit
FPGA: field-programmable gate array
FPU: floating point processing unit
GPU: graphical processing unit
HDD: hard disk drive (e.g. solid state, electromechanical, optical)
LAN: local area network
RAM: random access memory
ROM: read only memory
RUV: rack unit volume
W: watts Additional Terminology Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography. Quoted terms are being defined explicitly, but a term may also be defined implicitly without using quotation marks. Terms may be defined, either explicitly or implicitly, here in the Detailed Description or elsewhere in the application file.

As used herein, a "computer system" may include, for example, one or more servers, motherboards, processing nodes, and other devices having one or more processors controlled at least in part by instructions. The instructions may be in the form of firmware or other software in memory or specialized circuitry. Computer systems run software such as kernels and applications, for example.

A "processor" is a single independent hardware thread-processing unit, such as a core in a simultaneous multi-threading implementation. A processor includes hardware. Processors may be general purpose, or they may be tailored for specific uses such as graphics processing, signal processing, floating-point arithmetic processing, encryption, I/O processing, and so on.

"Kernels" include operating systems, hypervisors, and similar hardware interface software. BIOS code and similar code such as firmware are considered functionally part of a kernel.

"Code" means processor instructions, data (which includes constants, variables, and data structures), or both instructions and data. "Code" and "software" are used interchangeably herein. Executable code, interpreted code, and firmware are some examples of code.

"Logic" includes computing hardware controlled by software or firmware, for example, or special-purpose hardware configured for performing a particular function or algorithm, or both. Disembodied software alone does not qualify as "logic" herein; computational processing hardware is required. Logic may be digital or analog.

"Memory" means digital storage. Examples include, without limitation, processor registers, RAM, ROM, HDD, flash, and other digital storage, whether volatile or not, whether removable or not, and whether local to a chip, to a board, to a device, or not local. Whenever reference is made to data or instructions, it is understood that these items configure a computer-readable memory or computer-readable storage medium, thereby transforming it to a particular article, as opposed to simply existing on paper, in a person's mind, or as a mere signal being propagated on a wire, for example.

"Optimize" means to improve, not necessarily to perfect. For example, it may be possible to make further improvements in a device, program, or algorithm which has been optimized before.

"Program" is used broadly herein, to include applications, kernels, drivers, interrupt handlers, firmware, state machines, libraries, and other code written by programmers (a.k.a. developers) or automatically generated.

"Electronic device" means a physical device containing at least one of the following: processor, memory, logic, electronic circuitry, semiconductor chips, analog circuitry, hardware controlled by software, hardware which executes firmware, circuits whose normal operation requires a regulated source of electric power, or one or more digital components. Electronic devices include, but are not limited to, devices which perform digital computations.

"Fluid" means material which is neither solid nor plasma. Hence, fluids are liquid or gas or a mixture of liquid and gas. As used herein, "fluid" excludes breathable atmospheric air. Thus, a coolant fluid may be a coolant liquid, or it may be a mixture of coolant gases which differ in composition from the composition of ambient atmospheric air that is safely breathable by people. A coolant fluid may also be a mixture of one or more liquids and one or more gases.

As used herein, "include" allows additional elements (i.e., includes means comprises) unless otherwise stated. "Consists of" means consists essentially of, or consists entirely of. X consists essentially of Y when the non-Y part of X, if any, can be freely altered, removed, or added without altering the functionality of claimed embodiments so far as a claim in question is concerned.

"Method" is used herein as a patent law term of art, e.g., in describing a method (i.e., process) claim as opposed to a system claim or an article of manufacture (device) claim.

Throughout this document, use of the optional plural "(s)", "(es)", or "(ies)" means that one or more of the indicated feature is present. For example, "device(s)" means "one or more devices" or equivalently "at least one device".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted.

For the purposes of United States law and practice, the claims are not intended to invoke means-plus-function interpretation unless they use the phrase "means for". Claim language intended to be interpreted as means-plus-function language, if any, will expressly recite that intention by using the phrase "means for". When means-plus-function interpretation applies, whether by use of "means for" or by a court's legal construction of claim language, the means recited in the specification for a given noun or a given verb should be understood to be linked to the claim language and linked together herein by virtue of any of the following: appearance within the same block in a block diagram of the figures, denotation by the same or a similar name, denotation by the same reference numeral. For example, if a claim limitation recited a "zac widget" and that claim limitation became subject to means-plus-function interpretation, then at a minimum all structures identified anywhere in the specification in any figure block, paragraph, or example mentioning "zac widget", or tied together by any reference numeral assigned to a zac widget, would be deemed part of the structures identified in the application for zac widgets and would help define the set of equivalents for zac widget structures.

Throughout this document, unless expressly stated otherwise any reference to a step in a process presumes that the step may be performed directly by a party of interest or performed indirectly by the party through intervening mechanisms or intervening entities, and still lie within the scope of the step. That is, direct performance of the step by the party of interest is not required unless direct performance is an expressly stated requirement. For example, a step involving action by a party of interest such as closing, connecting, deploying, determining, engaging, installing, obtaining, performing, placing, preparing, putting, removing, replacing, separating, submerging (and closes, closed, connects, connected, etc.) with regard to an item or destination or other subject may involve intervening action by some other party, yet still be understood as being performed directly by the party of interest.

An "embodiment" herein is an example. The term "embodiment" is not interchangeable with "the invention". Embodiments may freely share or borrow aspects to create other embodiments (provided the result is operable), even if a resulting combination of aspects is not explicitly described per se herein. Requiring each and every permitted combination to be explicitly described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

LIST OF REFERENCE NUMERALS

The following list is provided for convenience and in support of the drawing figures and as part of the text of the specification, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. The list of reference numerals is:

100 cooled electronics module (CEM)
    102 cooling device container
    104 electronic device, a.k.a. electronics device
    106 motherboard
    108 logic, e.g., processor, memory, circuitry
    110 cooling device container closure
    112 cooling device connection block
    114 coolant-space-facing surface
    116 environment-facing surface
    118 external electronics connector
    120 coolant input
    122 coolant output
    124 electronics connector generally
    126 coolant space (may or may not contain some coolant)
    128 cooling device (CEM minus electronics device)

130 mouth of cooling device container
200 cutaway showing electronic device inside coolant container
302 internal electronics connector
304 valved inlet to the coolant space
306 valved outlet from the coolant space
400 facility or other operating environment
402 rail
404 cutaway showing coolant fluid inside container
406 coolant fluid
502 power line
504 coolant line
506 signal line
508 coolant line valve
510 signal connector
512 coolant connector
514 power connector
516 offset portion of a connection block
518 offset portion of a rail
602 extension portion, shown on cooling device connection block
604 container lip portion of cooling device connection block
606 container plug portion of cooling device connection block
1000 vane for directing coolant flow (shown attached to coolant container but may also be attached in some examples to an electronics device, or to other vane(s), or to a combination thereof)
1102 bolt hole
1104 bolt
1106 sealing surfaces of connection block and closure
1302 inner container
1304 outer container
1400 flowchart of first example of an initial deployment method
1402 obtaining coolant device
1404 placing coolant device connection block on at least one rail
1406 electrically connecting a coolant device to at least one infrastructure for power transmission, signal transmission, or both; this may also be referred to as "electronically connecting"
1408 putting coolant fluid into a coolant space, e.g., by pumping it in through a coolant input
1410 submerging an electronic device in a CEM in coolant fluid
1412 closing a cooling device container
1414 physically separating coolant space from ambient environment
1416 engaging cooling device inlet or outlet or both for coolant flow, e.g., by connecting a pipe or other line to a pool or reservoir of coolant
1702 preparing a coolant device for deployment by at least coupling an electronics device to a connection block of the device, putting coolant in the device coolant container, and closing the coolant container
1704 determining that a coolant device and its contained electronics device should be replaced
1706 removing a presently installed coolant device
1902 performing multiple operational steps with a single physical action
1904 repeating operational steps on multiple cooling devices
1906 initially deploying multiple cooling devices
1908 rapidly replacing (which may replace or supplement or both) one or more cooling devices
1910 installing one or more cooling devices through initial deployment or rapid replacement
1912 coupling an electronics device to a connection block, e.g., connecting a motherboard connector of the electronics device to an internal electronics connector of the connection block
1914:X reversing operational step X, e.g., reference numeral 1914:1406 indicates electrically disconnecting a coolant device, 1914:1408 indicates removing the coolant fluid from the coolant space, 1914:1410 indicates surfacing an electronic device so it is no longer submerged in coolant fluid, 1914:1412 indicates opening a cooling device container, 1914:1416 indicates disengaging one or more cooling device coolant connectors, 1914:1912 indicates decoupling an electronics device from a connection block, and so on
2000 infrastructure for at least two of: providing coolant flow, supplying electrical power, transmitting digital signals
2100 connection block wing top surface
2102 connection block top surface near wing (part of surface 116)
2104 connection block wing bottom surface
2106 connection block bottom surface near wing (part of surface 114)

Cooled Electronics Modules

FIG. 1 shows a cooled electronics module (CEM) 100, which includes a cooling device container 102, an electronic device 104, a cooling device container closure 110, and a cooling device connection block 112. The CEM 100 minus the electronic device 104 is an example of a "cooling device". Every CEM includes a cooling device, but not every cooling device is in a CEM; the difference is the presence or absence of an electronics device. Cooling devices are designated by reference numeral 128, whether part of a CEM or not.

Each of these CEM 100 components is illustrated in FIG. 1 by only one of many possible embodiments. CEM component embodiments may vary by shape, size, material used, electronic functionality if any, number and configuration of subcomponents such as those identified herein by respective reference numerals, placement of connectors, type of connectors, and in other ways that one of skill in the art will readily understand and recognize.

The illustrated cooling device container 102 is a bag with an opening on one end and a generally curved shape when filled. The container encloses a coolant space 126. In this unassembled configuration, the coolant space is enclosed by the bag 102 except at the bag's mouth 130, where the boundary of the coolant space is a hypothetical taut surface (not shown) whose perimeter matches the perimeter of the bag's mouth. Illustrated bag 102 is made of one or more materials which are flexible or impermeable or both, such as plastics, elastomeric layers, impermeable polymer films, graphene, elastomer/graphite nanocomposites, resins, metalized plastic, multilayer graphitic films, or other materials, which are formed into the container using deposition, lamination, and other processes. However, other suitable cooling device containers may have a polygonal solid, irregular, or other shape when filled, and may be made partially or entirely of rigid materials, such as rigid plastics. A suitable coolant container may have more than one opening (coolant flow inlets and outlets are not openings in this sense, and are valved in many embodiments) but a container 102 with a single opening will likely be favored in practice, as it will tend to be less susceptible to leaks and tend to require less assembly.

The illustrated electronic device 104 has logic 108 mounted on a single motherboard 106, and has an electronics connector 124 which is electrically and mechanically connectable to a matching connector in the connection block 112, to transfer power and signals between the logic and items outside the CEM 100. However, other electronic devices 104 may have more than one motherboard, may have daughter boards (not shown) mounted to the motherboard(s), may have shapes other than the generally rectangular shape illustrated, and may have connectors, heat sinks, vanes, antennas, batteries, LEDs, leads, and other subcomponents that are not shown in this Figure. Some examples of electronic devices include computer server blades, computer memory and other digital storage devices, and analog electronic devices, among other possibilities.

The illustrated container closure 110 is unitary, that is, formed from a single piece of material. However, other suitable closures may be formed from multiple pieces which are joined by bonding, adhesion, lamination, fastening, latching, removably engaging, attaching, or other operations performed on the pieces that form the container closure. The illustrated container closure 110 is a rectangular annulus, but other suitable closures may have other shapes, provided that the container, closure, and connection block when assembled fit together well enough to prevent undue leakage of coolant fluid when the embodiment is one in which coolant fluid is sealed (aside from flow for thermal transfer) inside the container. Whether coolant fluid leakage is "undue" depends on the particular embodiment, but unless otherwise specified, undue leakage is leakage which reduces the electronic device's operational uptime because maintenance or replacement is performed specifically to reduce, eliminate, or compensate for the leakage. The closure 110 may be formed of plastic, rubber, metal, resin, composite, or other material which has sufficient rigidity and strength to prevent undue leakage of coolant fluid from the container when the closure is assembled with the container and the connection block.

The illustrated connection block 112 is generally the shape of a rectangular solid, but other suitable connection blocks may have other shapes, provided they assemble with a correspondingly shaped closure 110 and container 102. The connection block may be formed of plastic, rubber, metal, resin, composite, or other material which has sufficient rigidity and strength to prevent undue leakage of coolant fluid from the container when the connection block is assembled with the container and the closure. Also, the coolant-space-facing surface 114 of the connection block should be chemically inert with respect to the coolant fluid to which the surface 114 is exposed.

The illustrated connection block 112 shows electronics connectors 118 on the block's environment-facing surface 116. These depictions are merely a visual placeholder to indicate that one or more electronics connectors 118 may be present in a given embodiment. Alternative embodiments place electronics connectors 118 instead, or in addition, on the closure 110. The depictions of electronics connectors 118 are not intended to specify the particular number, kind, standards-conformance, capacity, materials, location, size, or orientation of any electronics connector 118 used in a given embodiment.

The illustrated connection block 112 also shows coolant connectors 120, 122 on the block's environment-facing surface 116. These depictions are merely a visual placeholder to indicate that one or more coolant connectors may be present in a given embodiment. Alternative embodiments place one or more coolant connectors instead, or in addition, on the closure 110. The depictions of coolant connectors 120, 122 are not intended to specify the particular number, kind, standards-conformance, capacity, materials, location, size, or orientation of any coolant connector used in a given embodiment as the coolant input 120 or the coolant output 122.

FIG. 2 shows the FIG. 1 cooled electronics module 100 after it is assembled. As shown by cutaway 200, the electronic device 104 resides inside the closed container 102, within the coolant space 126.

In this assembled configuration, the external electronics connectors 118 are in electrical communication with the electronic device 104. "Electrical communication" or "electronic communication" means that electrical signals (control or data or otherwise), or electric power, or both, can flow and thereby support designed operations of the electronic device 104.

In this assembled configuration, the coolant connectors 120, 122 are in fluid communication with the coolant space 126. "Fluid communication" means that coolant fluid can flow into the coolant space if a valve in the coolant connector serving as coolant input is opened, or that coolant fluid can flow out of the coolant space if a valve in the coolant connector serving as coolant output is opened, or both.

FIG. 3 shows a coolant-space-facing side 114 of the cooling device connection block of FIG. 1. However, the coolant-space-facing side is not necessary planar in every embodiment and is not necessarily rectangular in every embodiment. In the illustrated view, an internal electronics connector 302 is visible. The internal electronics connector 302 provides a mechanical connection between the electronic device 104 and the connection block 112, and provides an electrical connection between the electronic device 104 and the external electronics connectors 118. The depiction in FIG. 3 is a visual placeholder to indicate that one or more electronics connectors 302 may be present in a given embodiment. The depiction of electronics connector 302 is not intended to specify the particular number, kind, standards-conformance, capacity, materials, location, size, or orientation of any electronics connector 302 used in a given embodiment.

FIG. 4 shows an assembled cooled electronics module 100 hanging on a pair of rails 402. The rails may be in a rack (not shown), or standalone, and may be in a datacenter, server room, research building, or other facility 400. A cutaway 404 shows a fluid coolant 406 (a.k.a. coolant fluid) inside a closed container 102 of the module 100. The depiction in FIG. 4 intentionally omits connectors, because it pertains not only to modules 100 which have fluid connectors and electronics connectors on top of the connection block 112, e.g., as in FIG. 2, but also to modules 100 which have fluid connectors or electronics connectors or both located elsewhere, e.g., on the sides of the of the connection block 112 or on the closure. The closure is not visible in FIG. 4 but is present in the assembled module 100.

Figure 5:
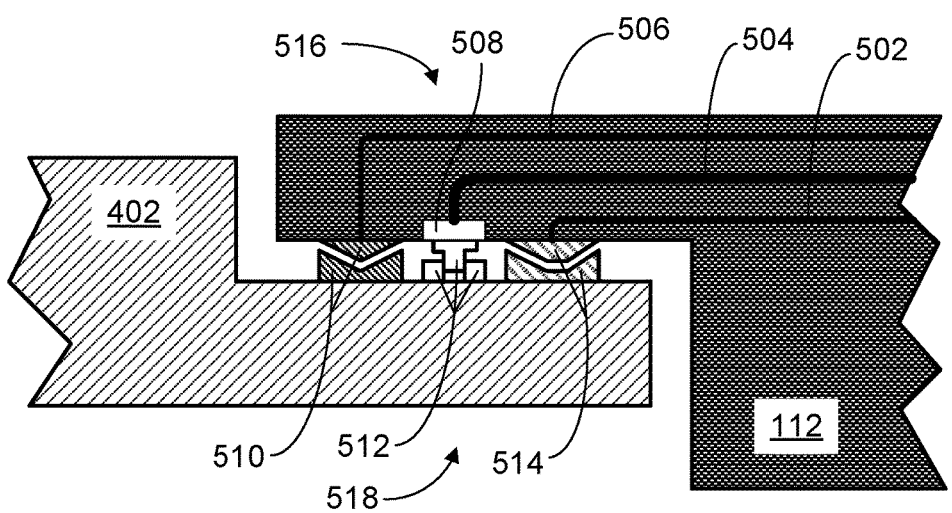
FIG. 5 is a side sectional view of an offset portion of a rail and an offset portion of a cooling device connection block, showing a signal connector and signal line, a coolant flow connector and coolant line, and a power connector and power line.

FIG. 5 shows a cross-sectional view of an offset portion 518 of a rail 402 and an offset portion 516 of a cooling device connection block 112. The illustrated embodiment also includes a signal connector 510 and a signal line 506, a coolant flow connector 512 and a coolant line 504 separated by a valve 508, such as a dripless valve, and a power connector 514 and a power line 502. Although for clarity of illustration only a single coolant flow connector and coolant line are shown in FIG. 5, a second coolant connector and coolant line will also be present, and may be located behind the ones shown, or located on the opposite side of the connection block, or located elsewhere in the CEM 100, so that both a coolant input and a coolant output are provided.

The coolant input and output may also be informally referred to as the "inlet" and "outlet" or as the "supply" and "return". Coolant flow connectors may also be referred to as "coolant connectors" and coolant lines may also be referred to as "coolant flow lines". Other embodiments of the connection block 112 and rail 402, which do not include offset portions like those shown in FIG. 5, may nonetheless include one or more signal connectors, signal lines, power connectors, power lines, coolant flow connectors and coolant lines.

Figure 11:
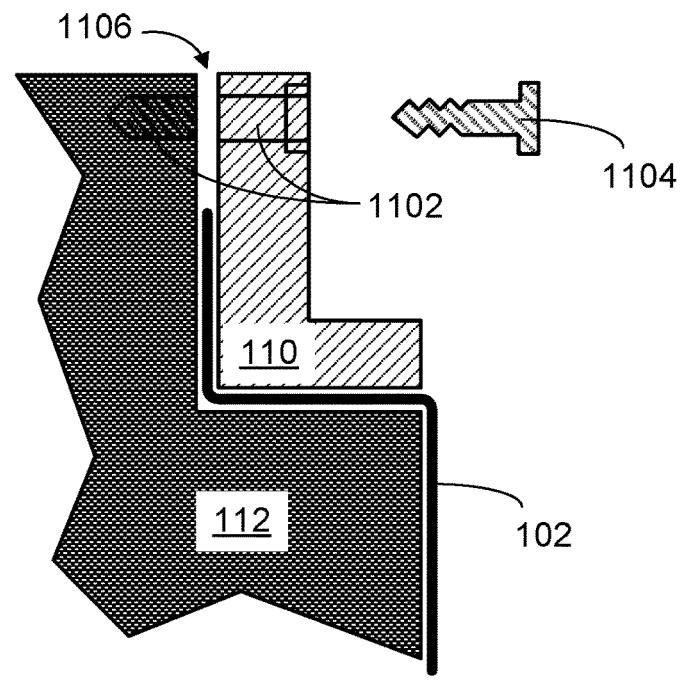
FIG. 11 is a side sectional view of a cooling device connection block, a flexible bag coolant container, and a closure which uses a bolt for mechanical attachment of the closure to the coolant container and the cooling device connection block.

The cross-hatch patterns shown in FIG. 5 and in FIG. 11 are not intended to designate any particular material or composition of matter. The rail 402, the connection block 112, and the closure 110 may each include various materials as noted elsewhere herein. The connectors 510, 512, 514 shown in cross-section in FIG. 5 likewise may include various suitable materials such as metal, plastic, or rubber, for example. Rather, cross-hatch patterns in the Figures merely indicate that a view with cross-hatch patterns is cross-sectional.

Figure 6:
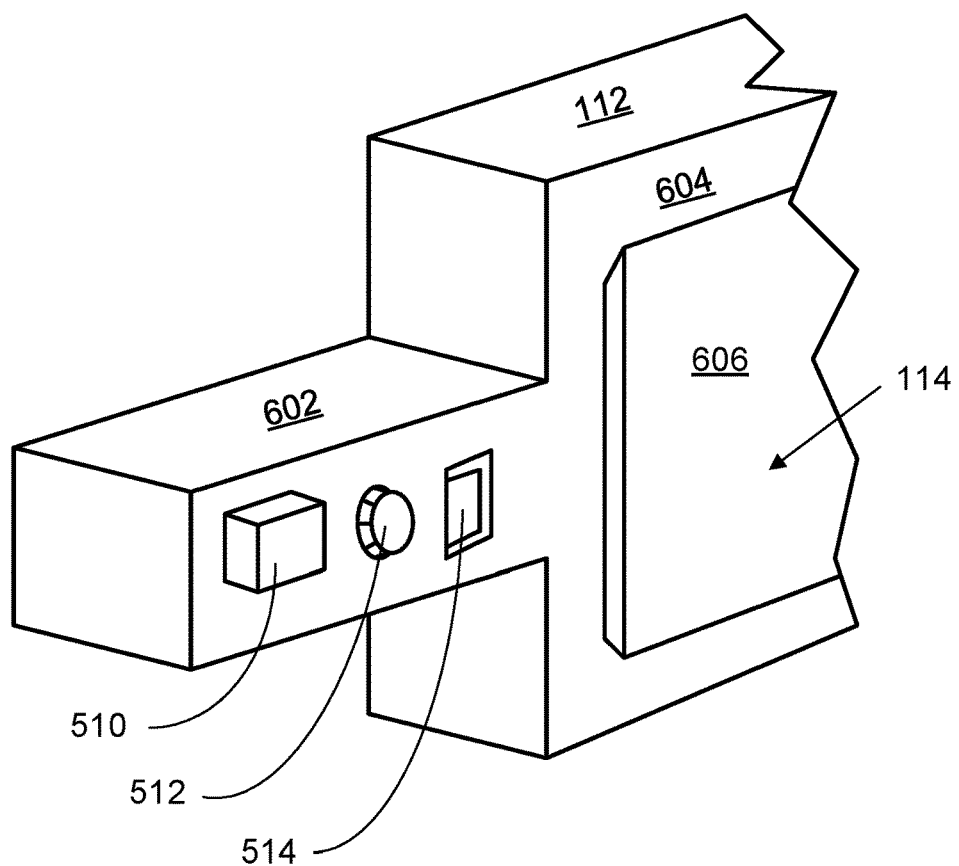
FIG. 6 is a perspective view of an extension portion of a cooling device connection block, showing a signal connector, a coolant flow connector, and a power connector.

FIG. 6 shows an extension portion 602 of a cooling device connection block 112. The illustrated extension portion 602 bears a signal connector 510, a coolant flow connector 512, and a power connector 514. These connector depictions in FIG. 6 are not intended to specify the particular number, kind, standards-conformance, capacity, materials, location on the extension portion 602, size, or orientation of any connector used in a given embodiment.

FIG. 6 also shows a lip 604 surrounding a plug 606 on the coolant-space-facing surface of the connection block 112. The plug 606 extends out from the plane defined by the illustrated lip 604. The lips 604 and plug 606 would be on the bottom of the connection block 112 when the vertical deployment shown in FIG. 4 is used. The closure 110 is not shown in FIG. 6, but some of the many possible closures 110 are shown in FIGS. 1, 2, 8, and 11. When a CEM 100 with a connection block 112 like the one shown in FIG. 6 is assembled, the closure clamps or otherwise presses the container 102 against the plug 606 to form a seal that contains the coolant fluid. The container 102 may also be clamped or otherwise pressed against the lip 604 in an assembled CEM 100.

Figure 7:
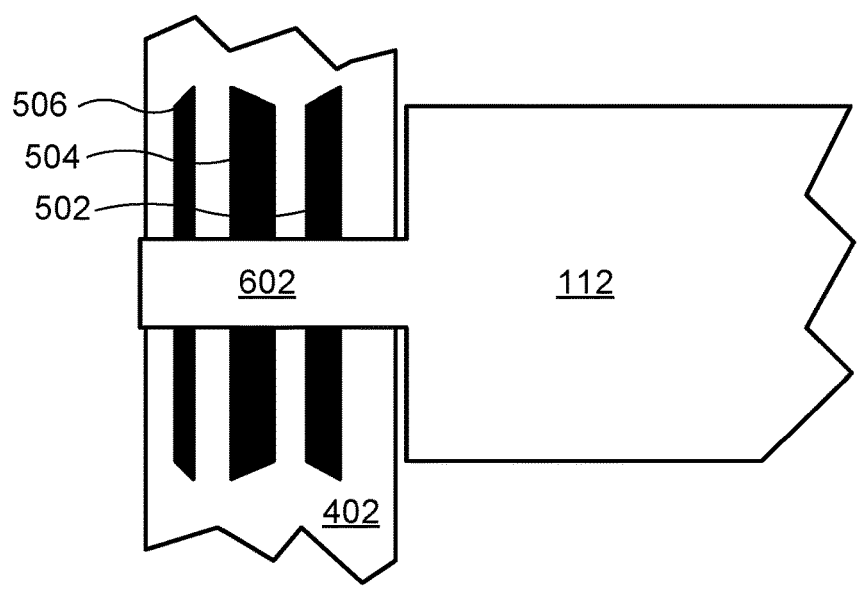
FIG. 7 is a top view of the cooling device connection block illustrated in FIG. 6, suspended on and connected to a signal line, a coolant line, and a power line.

FIG. 7 shows a top view of the cooling device connection block 112 illustrated in FIG. 6, with the extension 602 suspended on a rail 402 and connected by connectors (not shown in this Figure; see FIG. 5) to a signal line 506, a coolant line 504, and a power line 502. This configuration resembles the configuration shown in FIG. 4, in that both configurations depict a CEM 100 hanging vertically from at least one rail 402. However, the FIG. 4 embodiment does not have connection block extension portions, whereas the FIG. 7 embodiment does. Also, the FIG. 4 embodiment expressly includes two rails 402; the FIG. 7 connection block embodiment could likewise be on two rails with respective extensions, but it could also be on a single rail with a hook or latch or other attachment on the side of the connection block that is not shown.

FIG. 8 shows a coolant-space-facing side of a cooling device connection block 112 and a two-piece closure 110. The illustrated closure 110 includes two pieces which can be assembled to one another and to the connection block 112 to close a coolant bag (not shown; see other Figures). The pieces of the closure 110 may be assembled, for example, by bolting them together, by engaging ratchet teeth, by fitting springy or spring-loaded extensions into matching orifices, or by other familiar fastening or attachment mechanisms.

FIG. 9 shows a coolant container 102 having a coolant input 120 and a coolant outlet 122 in the sides of the container, as opposed to having one or both coolant flow paths go through a connection block 112 as shown, e.g., in FIGS. 2 and 5. As in some other examples, the coolant input 120 and coolant outlet 122 are valved (i.e., they each include a valve) to prevent or reduce coolant fluid leakage.

FIG. 10 is a top view of a coolant container 102 showing a vane 1000 attached to the coolant container interior for directing coolant flow within the container. The vane may be made of plastic, for example, and may be secured to the interior of the container by an adhesive, by thermal coupling, or other familiar approaches. The vane may be shaped and positioned to direct coolant toward a processor or a heat sink, for example, so that logic 108 that produces more heat or that is more sensitive to heat, relative to other logic of the electronics device, receives more coolant fluid, or cooler coolant fluid, or both. Although not shown, vanes 1000 may also be secured to one another or to the electronic device.

FIG. 11 is another sectional view, showing a cooling device connection block 112, a flexible bag coolant container 102, and a closure 110 which uses a bolt 1104 secured in a matching bolt hole 1102 to help provide a mechanical attachment of the closure to the coolant container and the cooling device connection block. As noted, the cross-hatch patterns merely indicate the view is sectional; they do not specify materials for the illustrated components. Also, as one of skill understands, the actual dimensions shown in the drawings do not necessarily define the dimensions of any given physical embodiment.

Figure 12:
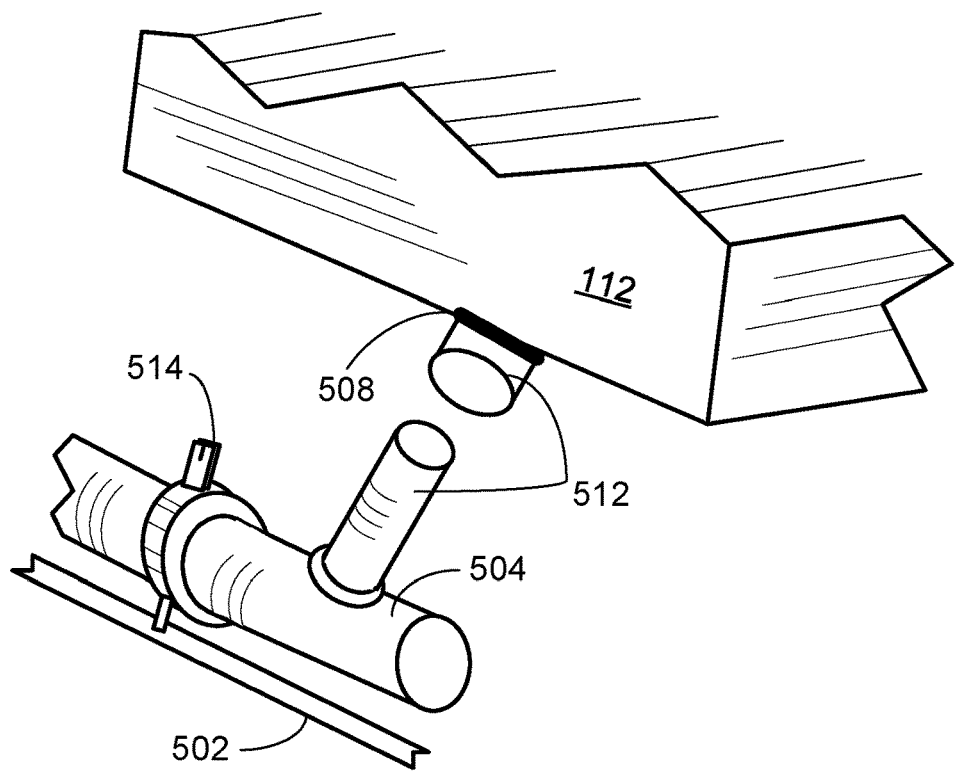
FIG. 12 is a perspective view of a portion of a power line, a portion of a coolant line, a coolant valve, and a portion of a cooling device connection block.

FIG. 12 shows a portion of a power line 502 and a portion of a coolant line 504. A coolant connector 512 includes a valve 508. The coolant connector 512 resides partially on the coolant line 504 and partially on a portion of a cooling device connection block 112. A rail is not shown, but the power line 502 and coolant line 504 could be part of a rail. Alternately, they might be separate from a rail that only gives mechanical support. Another alternative is that no rail is present. The connector depictions in FIG. 12 are not intended to specify the particular number, kind, standards-conformance, capacity, materials, location, size, or orientation of any connector used in a given embodiment.

Figure 13:
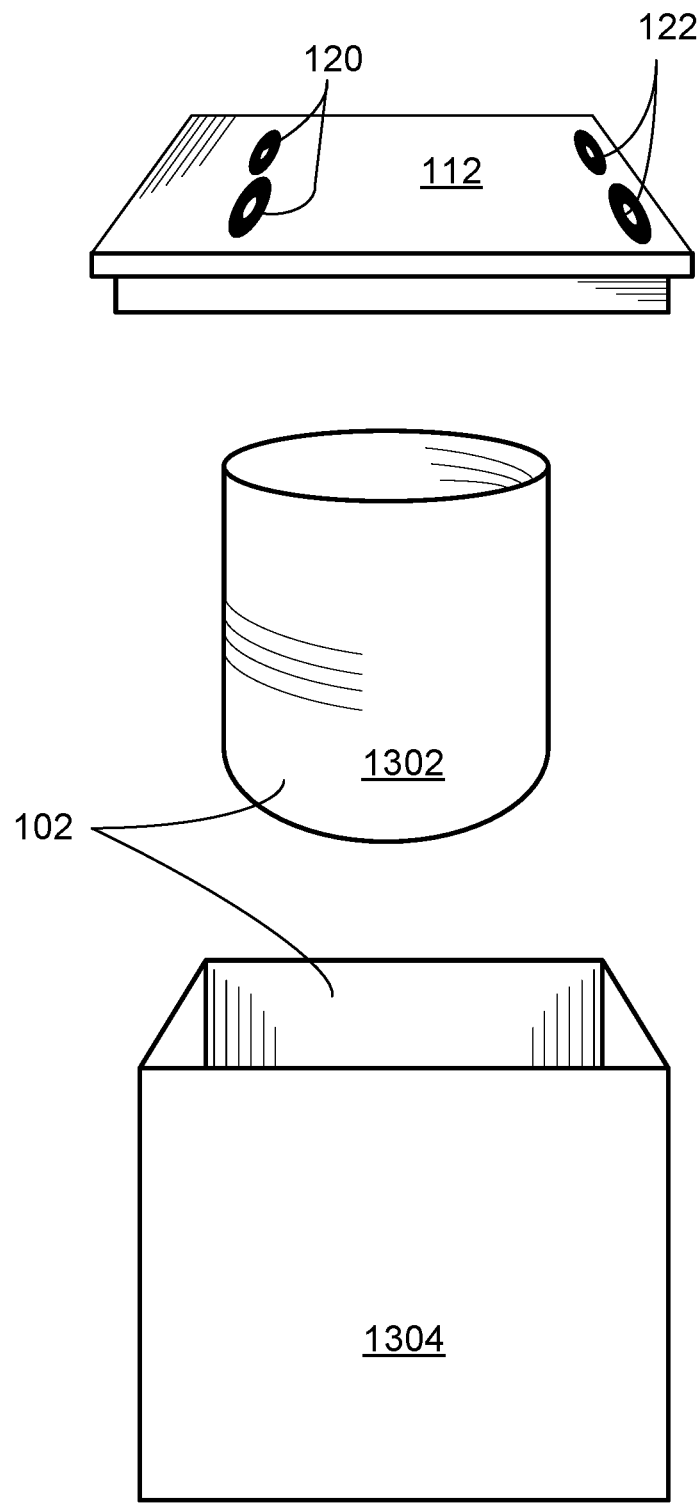
FIG. 13 is an exploded perspective view of part of a cooling device, showing a cooling device connection block and a coolant container which includes an inner container and an outer container whereby the coolant container encloses two coolant spaces when assembled.

FIG. 13 shows a cooling device connection block 112 and a coolant container 102. The illustrated coolant container 102 includes an inner container 1302 and an outer container 1304. When the containers 1302, 1304 are assembled together with the connection block 112 and a closure (not shown), the coolant container 102 encloses two coolant spaces: one space is entirely within the inner container 1302, and one space is outside the inner container 1302 but inside the outer container 1304. Accordingly, the illustrated connection block 112 has two sets of coolant connectors—one for each coolant space. Different coolant fluids may be used in the different coolant spaces, with thermal transfer of heat from the innermost coolant to the outer coolant that is located between the two containers 1302, 1304. Alternately the same coolant fluid may be used in both coolant spaces, but with different pressures, different flow rates, different flow cycle lengths, different rates for complete replacement of fluid within the coolant space, and so on.

FIG. 20 shows a slightly exploded perspective view of a T-shaped connection block 112 in a packed layout with two other T-shaped connection blocks 112 (only portions of the latter two blocks are shown). As illustrated, using T-shaped connection blocks facilitates packing CEMs 100 more closely together than would be possible, e.g., if connection blocks were simple rectangles. Each CEM may have the same kind of server in these examples. The T-shapes permit a single stock-keeping unit (SKU) to be used, because instances of that single SKU CEM can be packed together by rotating alternate instances 180 degrees from their neighbors. One of skill will appreciate that T-shapes are not the only shapes that permit packing like that shown in this example. In general, any connection block shapes that have one or more extensions and have corresponding space(s) to accommodate another OEM's extension(s) can be used by fitting the OEMs together (possibly with gaps) in a configuration that gives each CEM access to the infrastructure 2000 through lines 502, 504, 506 by way of that OEM's extension(s). Fitting OEMs together may increase packing density and reduce the number or length or both of conduit runs and pipe runs in a given deployment. Alternatives may involve multipurpose connectors, stacked conduit, stacked pipe, power above communication lines, power above cooling lines, or communication lines above cooling fluid lines, for example.

As shown in FIG. 21, CEMs like those shown in FIG. 20 and other CEMs may have connectors 510, 512, 514 located under extensions 602 that loosely resemble a wing. When the CEM is deployed vertically, the wing-format extensions have a top surface 2100 that is below a top surface 2102 of the connection block 112, and the wing-format extensions have a bottom surface 2104 that is above a bottom surface 2106 of the connection block 112. Coolant fluid and electrical connectors may be located under the wing 602, as shown in FIG. 21 or FIG. 5, for instance.

In FIGS. 22 and 23, the labels A, B, C, D, E have the following meaning:
A: coolant fluid supply
B: electrical power (positive)
C: digital signals, e.g., communication line(s)
D: coolant fluid return
E: electrical power (negative)

One of skill will appreciate that the two examples shown in FIGS. 22 and 23 do not cover all possibilities. Other embodiments may arrange the fluid, power, and signal lines differently relative to one another, and may have multiple communication lines, for instance.

Cooled Electronics Module Installation Methods

Figure 14:
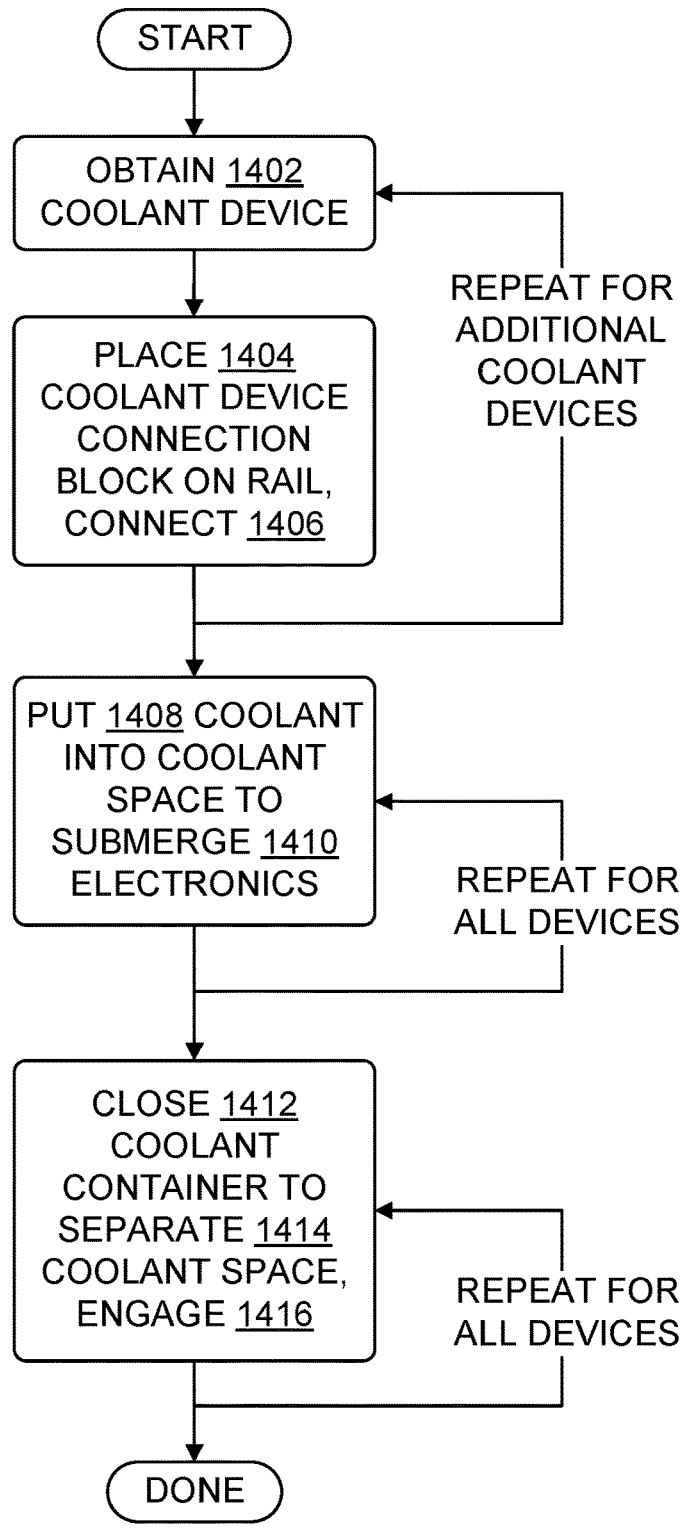
FIG. 14 is a flowchart illustrating a first example method for initial deployment of multiple coolant devices in a facility.

FIG. 14 shows a flowchart 1400 illustrating a first example method for initial deployment of multiple coolant devices in a facility. Coolant devices are also referred to herein as "cooling devices". At box 1402, a person or robot performing the method obtains a coolant device 128, namely, a coolant container 102, a closure 110, and a connection block 112. The cooling device 128 components may be obtained from a stockroom or a vendor, for example. These components may be assembled as part of obtaining 1402 them, or be partially assembled, or the cooling device may have been previously assembled, depending on the particular method embodiment. In some embodiments, but not necessarily all, the placed cooling device will have an electronics device 104 already electrically and mechanically connected to the connection block when the cooling device is obtained, and thus a cooled electronics module 100 will also be obtained by obtaining the cooling device.

Continuing the example of FIG. 14, the assembled cooling device is placed 1404 on at least one rail 402. If an electronics device 104 is connected to the connection block at this point, which is expected to be the most common case, then step 1404 places a CEM 100 of which the cooling device is part. In other cases, the electronics device 104 may be plugged into the connection block after the connection block is placed, and then the coolant container can be put over the electronics device 104 and closed with the closure.

This may happen, for example, when the device 128 is positioned horizontally against a rail instead of being hung vertically from a rail. Regardless, the action of placing the device 128 may also form 1406 one or more electronic connections. Alternately, an action distinct from the placement action may be performed to connect 1406 the cooling device to an electronics infrastructure, such as a power supply system (not shown) and a LAN or other network (not shown).

The method illustrated in FIG. 14 then repeats the obtaining 1402, placing 1404, and electronically connecting 1406 steps for zero or more additional cooling devices. In the initial deployment of servers 104 in a data center 400, for example, hundreds or thousands of cooling devices 128 may be obtained 1402 and placed 1404 and connected 1406 before any coolant fluid is put into the cooling devices. Thus, the actions of moving devices within the facility and placing them and connecting them can be done without bearing the weight of the coolant fluid each time. Instead, as taught with FIG. 14, after the coolant devices are placed, a person or robot (not shown) can travel from placed device 128 to placed device 128 with a tank (not shown) of coolant fluid, and pump 1408 coolant fluid into the coolant space 126 to submerge 1410 the electronic device in each cooling device.

As used herein, "submerge" includes but does not require complete immersion of an electronic device in coolant fluid. The electronic device is considered to be submerged when any one or more of the following conditions is satisfied: (a) the electronic device is completely immersed in coolant fluid, (b) at least half of the surface area of the electronic device is in direct physical contact with coolant fluid, (c) at least half (by volume) of the coolant space inside the coolant container with the electronic device before coolant fluid was put 1408 inside the coolant space is now occupied by coolant fluid.

As indicated in FIG. 14, after the cooling devices have been placed 1404 and coolant fluid has been put 1408 in them, they are closed 1412 using their respective closures 110. Closing 1412 physically separates 1414 the coolant space with the coolant and submerged electronics from the ambient environment 400. After this separated space is engaged 1416 with the coolant plumbing infrastructure, e.g., by connecting infrastructure cooling lines 504 with the cooling device inlet 120 and outlet 122, a closed system exists in which the coolant can flow to carry heat away from the electronics device in the installed CEM.

Variations on the method illustrated in flow chart 1400 may differ in the order of some of the steps. Variations directed to initial deployment will still begin with obtaining 1402 a coolant device, will include placing 1404 a given device 128 before putting 1408 coolant its container, will include closing 1412 the device's container after putting 1408 coolant in it, and will involve repeating these operations with these order constraints for multiple respective cooling devices 128. However, the operational steps for a given device 128 may be interleaved in some variations, and may all be performed for a given device before moving to the next device in other variations. Also, the operational step of connecting 1406 a device 128 electrically may precede or follow the step of placing 1404 the device on one or more rails, and the operational step of engaging the device 128 for coolant fluid flow may precede or follow the step of closing 1412 the device's coolant container.

Figure 15:
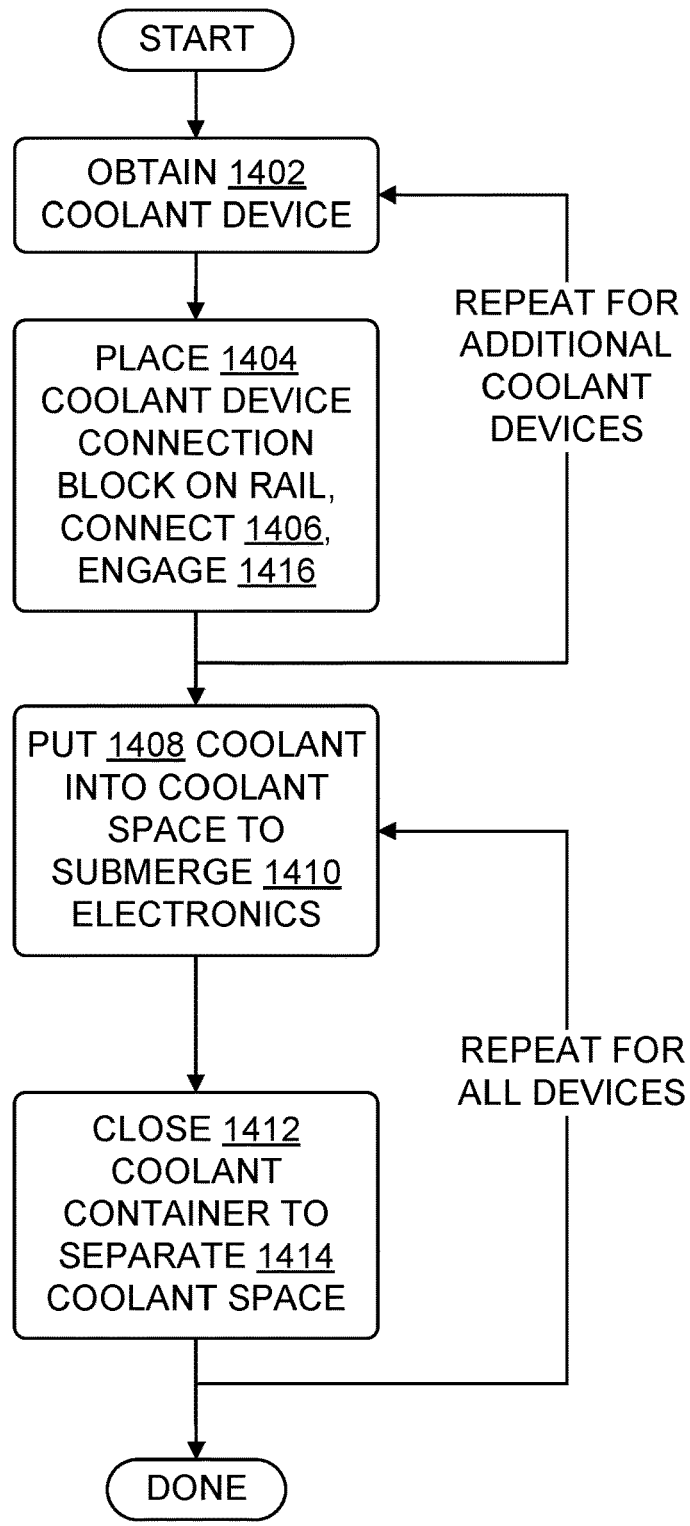
FIG. 15 is a flowchart illustrating a second example method for initial deployment of multiple coolant devices in a facility.

FIG. 15 shows a flowchart 1500 illustrating a second example method for initial deployment of multiple coolant devices 128 in a facility 400. The set of operational steps shown is the same set as in FIG. 14: obtaining 1402 the device, placing 1404 the device on rail(s), electrically connecting 1406 the device's external electrical connector(s) for power or signal transmission or both, putting 1408 coolant fluid into the device's container and thereby submerging 1410 the electronics device(s) inside the container, closing 1412 the container and thereby separating 1414 the coolant space from the ambient facility space, and engaging 1416 the device for coolant flow through at least one inlet 120 and at least one outlet 122. In FIG. 15, however, the order of some operational steps for a given coolant device 128 differs from the order shown in FIG. 14, and the subset of steps that are repeated for a given device 128 differs from the subset shown in FIG. 14. These differences are readily apparent to one of skill and thus not recited in this text.

The preceding paragraph, and other paragraphs herein, use the term "set" with regard to a list of steps. Sequences have order; sets do not. Use of the term "set" herein with regard to the recitation of a textual list of operational steps is intended to emphasize that no performance order is implied by the order in the textual recitation. The members of a set may be recited in text as "x, y, z" but because it is a set, not a sequence, the order of performance may be y then x then z, or it may be x then z then y, or x then y then z, and so on.

Figure 16:
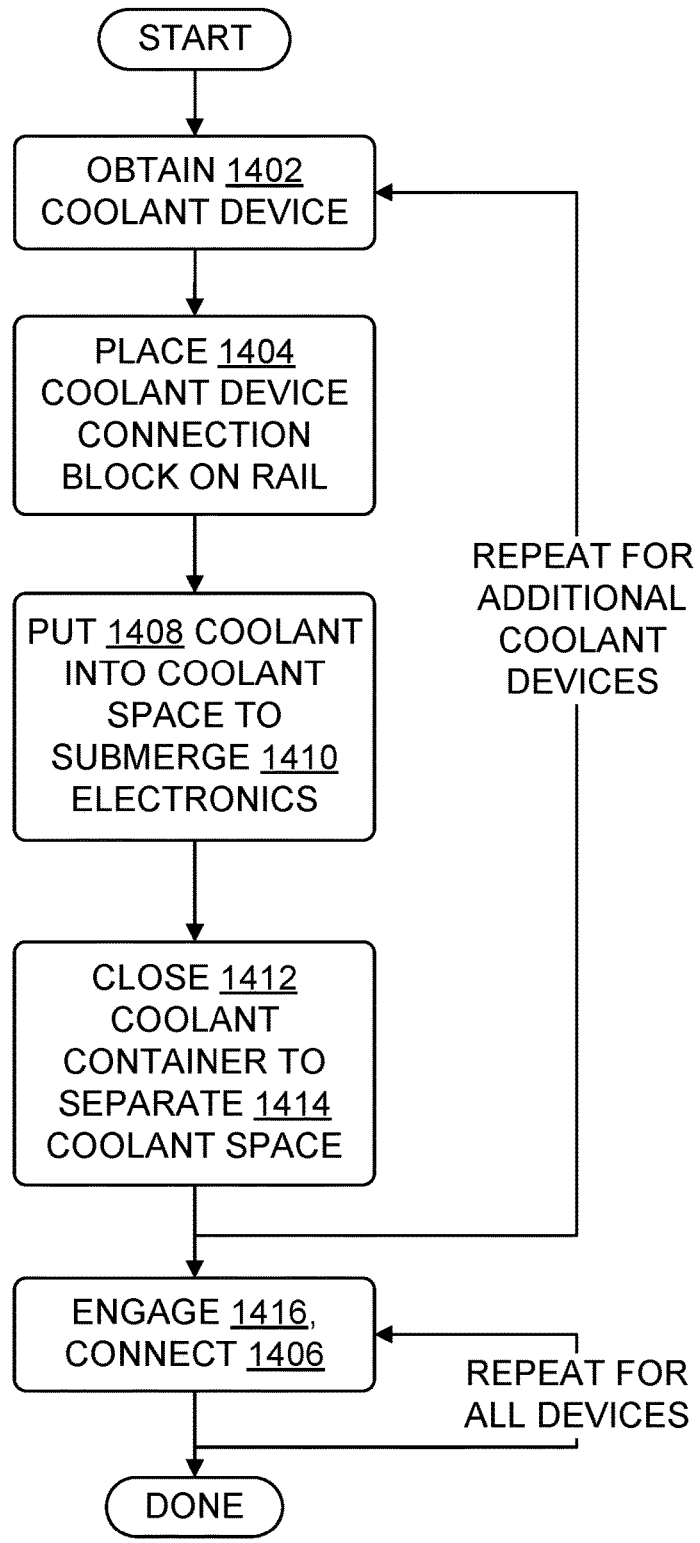
FIG. 16 is a flowchart illustrating a third example method for initial deployment of multiple coolant devices in a facility.

FIG. 16 shows a flowchart 1600 illustrating a third example method for initial deployment of multiple coolant devices 128 in a facility 400. The set of operational steps shown is the same set as in FIG. 14 and FIG. 15. In FIG. 16, however, the order of some operational steps for a given coolant device 128, and the subset of steps that are repeated for a given device 128, each differ from the examples shown in FIG. 14 and FIG. 15. These differences are readily apparent to one of skill and thus not recited in this text.

Figure 17:
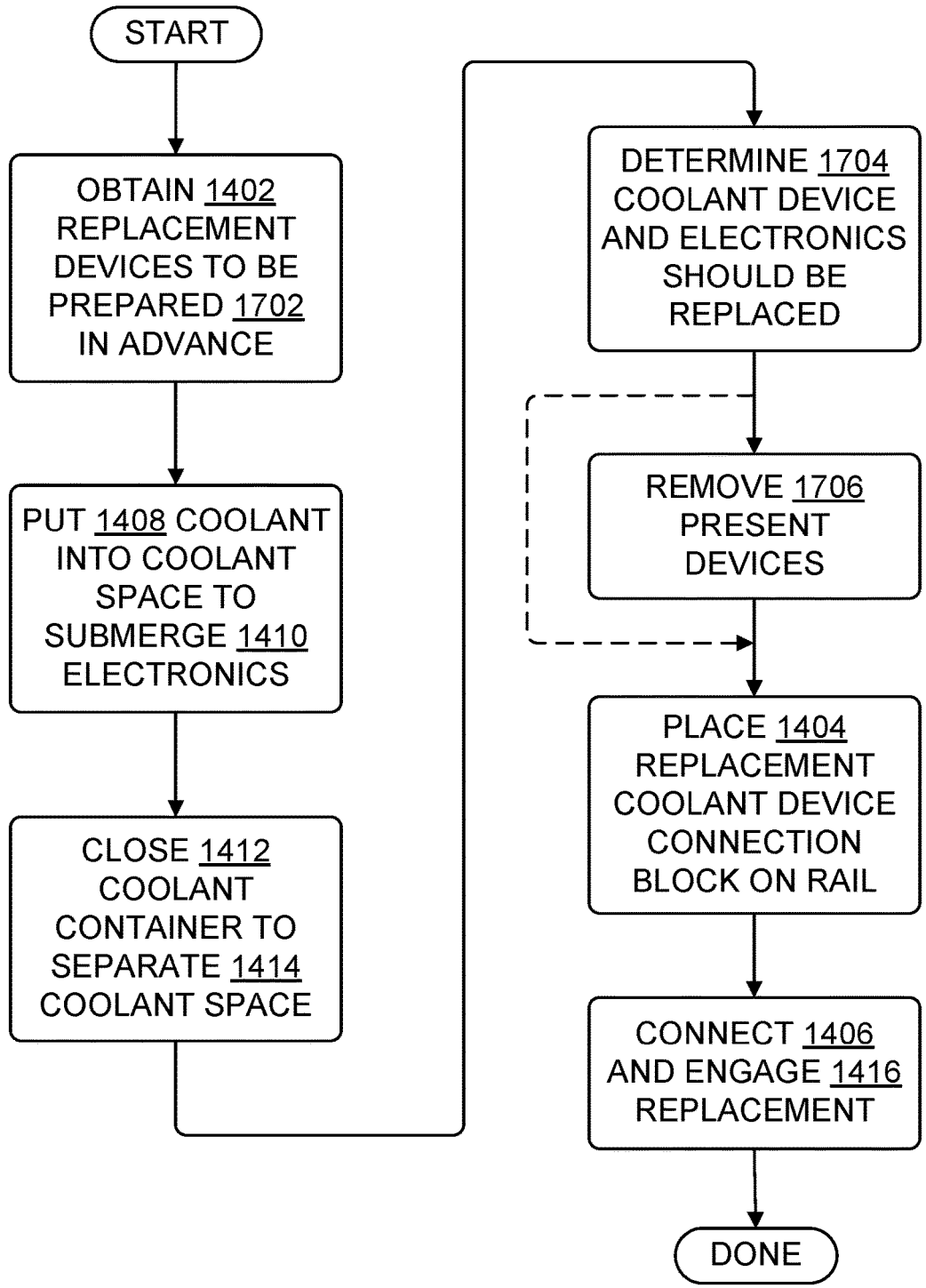
FIG. 17 is a flowchart illustrating a first example method for rapid replacement of a coolant device previously deployed in a facility.

FIG. 17 shows a flowchart 1700 illustrating a first example method for rapid replacement of a coolant device previously deployed in a facility. In general, rapid replacement refers to replacement or supplementation or both, as opposed to initial deployment. "Rapid replacement" (a) replaces or (b) supplements, or both. Following the dashed line in the flowcharts to skip removal 1706 corresponds to a supplementation version of rapid replacement, whereas performing removal 1706 corresponds to a replacement version of rapid replacement. When rapid replacement replaces, it replaces a coolant device 128 that was previously installed (on rails, hooks, or otherwise), was electronically connected 1406, was coolant flow engaged 1416, and was electronically active (e.g., a contained electronics device was computationally active). When rapid replacement supplements, it adds capacity to multiple such previously installed, electronically connected, coolant flow engaged, and electronically active coolant devices 128. When rapid replacement replaces and supplements, it both replaces and supplements the previously installed devices 128. By contrast, initial deployment deploys (e.g., electronically connects and coolant flow engages) multiple coolant devices 128 in a facility, or in a distinct portion of a facility, which did not yet contain installed and working devices 128. Another distinction that will often exist in practice is that replacement devices 128 (for replacement or supplementation or both) will contain coolant fluid, but initially deployed devices 128 will receive coolant fluid for the first time as part of their initial deployment.

The "rapid" in "rapid replacement" does not impose a particular time limit but serves instead to indicate that time need not be spent putting 1408 coolant in a container after determining 1704 that a CEM should be replaced or supplemented, because that coolant filling will have already been done.

The set of operational steps shown in FIG. 17 includes some previously discussed steps, or variations on them, such as obtaining 1402 a cooling device 128, placing a device 128, electrically connecting 1406 the device 128, and so on. In addition, FIG. 17 presents a step of preparing 1702 a coolant device 128 in advance of the device's deployment. Preparing 1702 includes at least coupling 1912 an electronics device 104 to a connection block of the device 128, putting 1408 coolant in the device 128 coolant container, and closing the coolant container.

FIG. 17 also presents a step of determining 1704 that a coolant device 128 and its contained electronics device should be replaced. This determination may be made, for example, by doing one or more of the following: (a) detecting a possible electronics device hardware failure by using a software performance monitor, (b) predicting an imminent electronics device hardware based on mean time between failure history or vendor specifications, (c) detecting a coolant fluid leak by human visual inspection, (d) detecting a coolant fluid leak by automated visual inspection with a computer vision system, (e) detecting a possible coolant fluid leak using a flow rate sensor or pressure sensor. This is not a complete list; these are merely some examples of how determination 1704 could be implemented in a given embodiment.

FIG. 17 also presents a step of removing 1706 a presently installed coolant device 128, namely, a device 128 that was previously connected 1406 and fluid engaged 1416. This removal may done, for example, by disengaging 1914:1416 the device's fluid connectors 512, by disconnecting 1914: 1406 the device's electrical connectors 510 and 514, and by physically moving (displacing 1914:1404) the device 128 off of the rail(s), hook(s), shelf, or other device mounting structure(s) it was deployed on. The removal 1706 may be performed by a robot, by a human technician, or by a combination of human and automated actions.

Variations on the method illustrated in flow chart 1700 may differ in the order of some of the steps. Variations directed to rapid replacement will still include determining 1704 that replacement is indicated before placing 1404 a replacement or supplementation CEM 100, and will include coupling 1912 the electronics device to the cooling device to support CEM 100 formation and include putting 1408 coolant in the CEM container 102 before placing 1404 the replacement or supplementation CEM 100. Multiple OEMs (and hence their constituent cooling devices 128) may be installed in some variations of the method illustrated in flow chart 1700.

Figure 18:
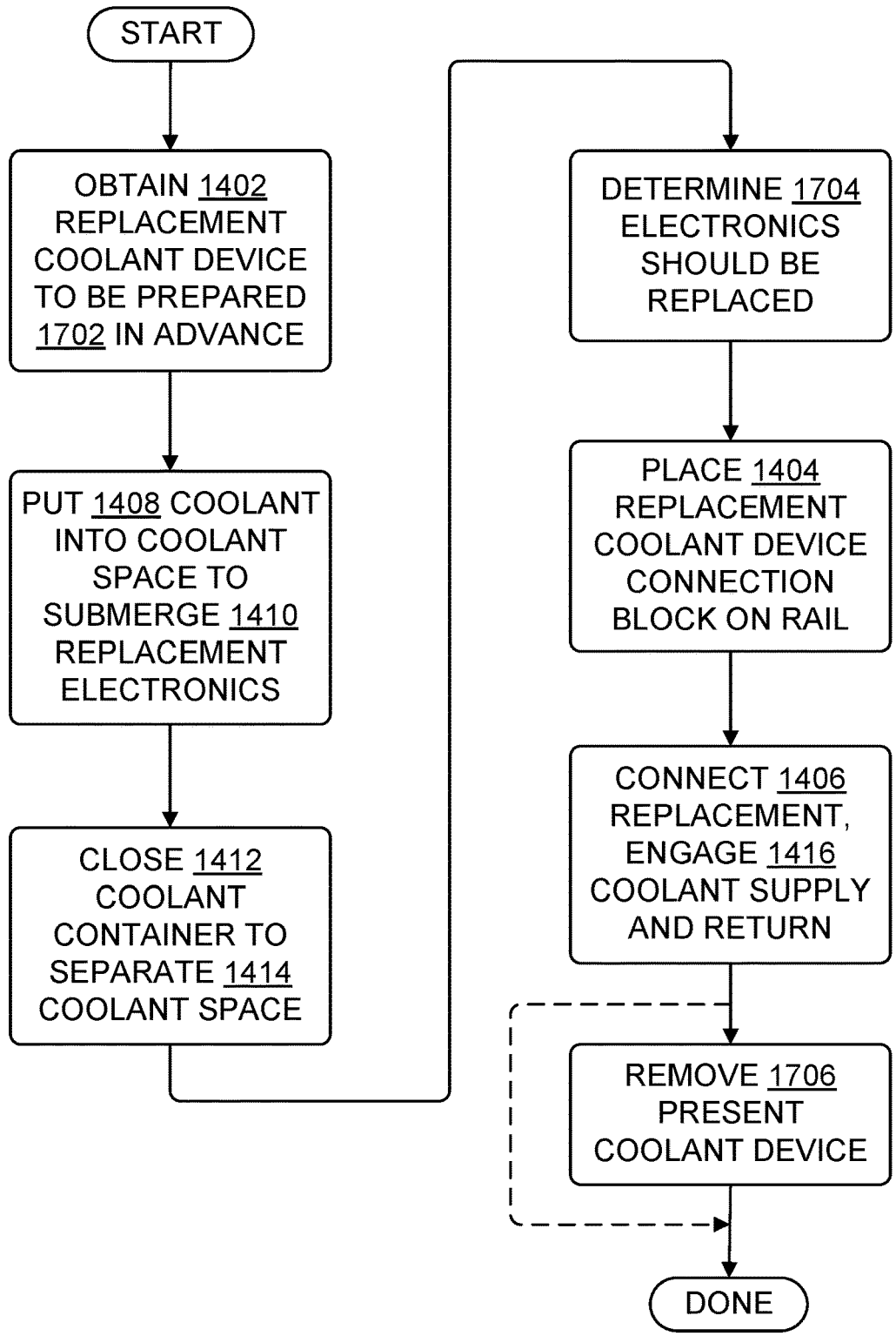
FIG. 18 is a flowchart illustrating a second example method for rapid replacement of a coolant device previously deployed in a facility.

FIG. 18 shows a flowchart 1800 illustrating a second example method for rapid replacement of a coolant device previously deployed in a facility. The set of operational steps shown is the same set as in FIG. 17. In FIG. 18, however, the order of some operational steps for a given coolant device differ from the example shown in FIG. 17. These differences are readily apparent to one of skill and thus not recited in this text.

Figure 19:
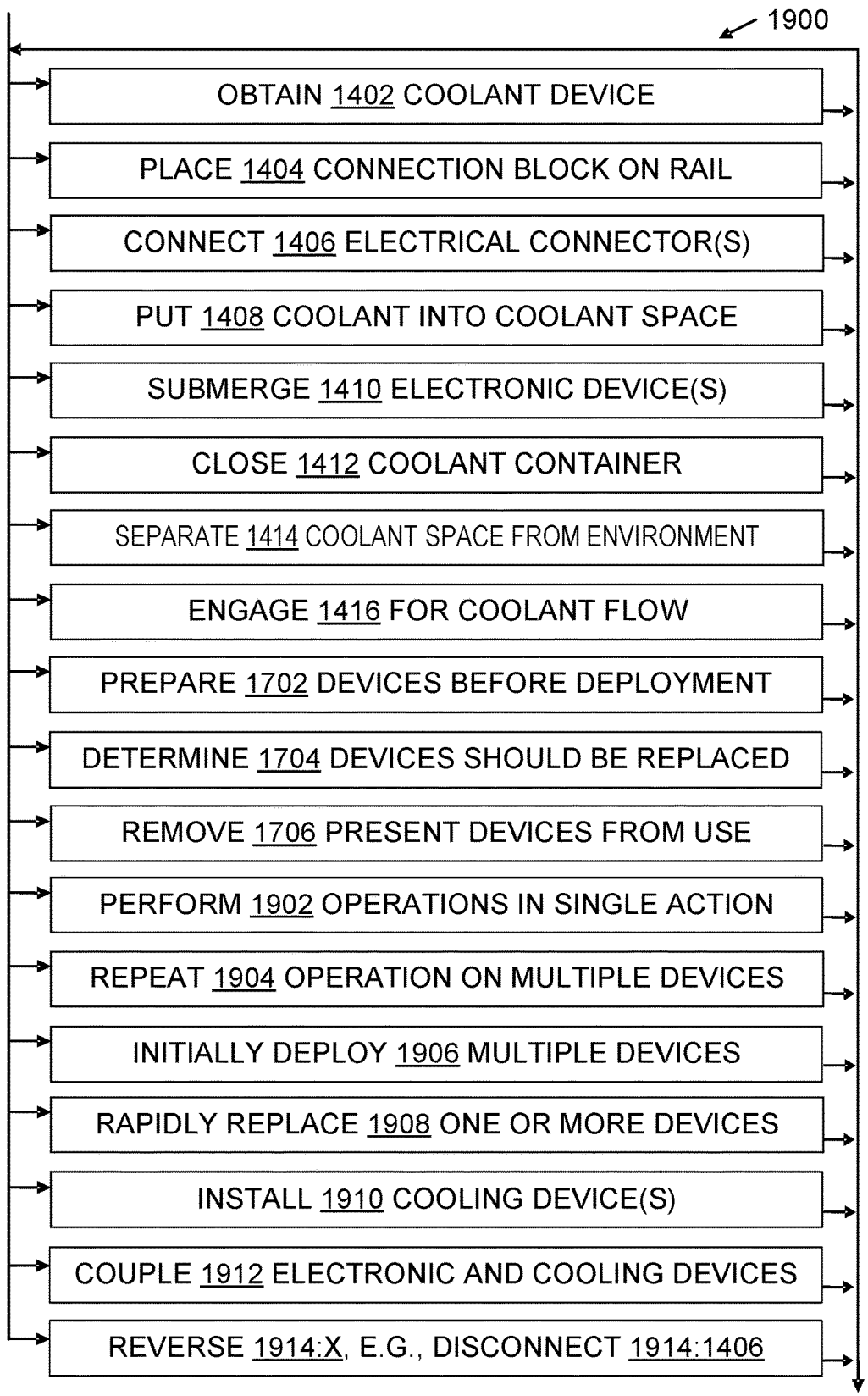
FIG. 19 is a flowchart illustrating various methods for installing one or more coolant devices.

FIG. 19 shows a flowchart 1900 illustrating various methods for installing one or more coolant devices. Many of the steps have already been discussed, but some additional observations may be made here. In a given embodiment zero or more illustrated steps of a method may be repeated, perhaps with different devices or components to operate on. Steps in an embodiment may also be done in a different order than the top-to-bottom order that is laid out in FIG. 19.

Steps may be performed serially, in a partially overlapping manner, or fully in parallel. The order in which flowchart 1900 is traversed to indicate the steps performed during a method may vary from one performance of the method to another performance of the method. The flowchart traversal order may also vary from one method embodiment to another method embodiment. Steps may also be omitted, combined, renamed, regrouped, or otherwise depart from the illustrated flow, provided that the method performed is operable and conforms to at least one claim.

As indicated with reference numeral 1902, some operational steps may be effectively performed with a single physical action, e.g., an act of positioning a CEM may serve both to place 1404 it on rails and connect 1406 it electronically. Indeed, in some embodiments, positioning a CEM may place 1404 it on rails, connect 1406 it electronically, and also engage 1416 it for coolant flow. Similarly, adding coolant may both put 1408 coolant in the CEM and submerge 1410 the electronic device in the coolant. Closing 1412 the container also separates 1414 the coolant space inside the container from the ambient space.

As indicated with reference numeral 1904, some operational steps may be repeated on multiple devices. This is also shown in the flowcharts by arrows labeled with the word "repeat". Repetition is given its own reference numeral 1904 in case a repeating step is explicitly claimed in a jurisdiction which requires each claimed step to have an associated reference numeral.

Reference numeral 1906 refers to any set of steps which is performed in a sequence that is consistent with flowchart 1400, flowchart 1500, flowchart 1600, or any sequence consistent with the variations noted in the text of this disclosure as a possible variation of any of these three flowcharts 1400, 1500, 1600.

Reference numeral 1908 refers to any set of steps which is performed in a sequence that is consistent with flowchart 1700, flowchart 1800, or any sequence consistent with the variations noted in the text of this disclosure as a possible variation of either of these two flowcharts 1700, 1800.

Reference numeral 1910 refers to any set of steps which is performed in a sequence that is consistent with flowchart 1400, flowchart 1500, flowchart 1600, flowchart 1700, flowchart 1800, or any sequence consistent with the variations noted in the text of this disclosure as a possible variation of any of these five flowcharts 1400, 1500, 1600, 1700, 1800.

Facility Operating Environments

A facility 400 or other operating environment for an embodiment may be part or all of a cloud or datacenter or other computing facility, or part or all of an automated manufacturing facility, or part or all of a research facility, for example, in addition to other possibilities identified herein. In many cases, the operating environment includes at least one computer system which includes or communicates with the electronic devices 104. The electronic devices may be part of a multiprocessor computer system, or not. An operating environment may include one or more machines in a given computer system, which may be clustered, client-server networked, or peer-to-peer networked within a cloud. An individual machine is a computer system, and a group of cooperating machines is also a computer system. A given computer system may be configured for end-users, e.g., with applications, for administrators, as a server, as a distributed processing node, or in other ways.

In some embodiments, an electronic device 104 has logic 108 which includes at least one processor and one or more computer-readable storage media. Media may be of different physical types. The media may be volatile memory, non-volatile memory, fixed in place media, removable media, magnetic media, optical media, solid-state media, or other types of physical durable storage media (as opposed to merely a propagated signal). One of skill will understand that when functionality is implemented in firmware or other software, the same or similar functionality can often be implemented, in whole or in part, directly in hardware logic 108, to provide the same or similar technical effects. For example, and without excluding other implementations, an embodiment may include hardware logic components such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar hardware logic components. Components of an embodiment may be grouped into interacting functional modules based on their inputs, outputs, or their technical effects, for example.

In addition to processors (CPUs, ALUs, FPUs, and GPUs), and memory/storage media, an electronic device 104 may also include other hardware, such as batteries, buses, wired and wireless network interface cards, accelerators, and heat sinks, for instance. In some embodiments, a system of electronic devices 104 are connected in a network. In some embodiments, a computing system which includes one or more CEMs operates as at least one of the following: a server computer, a cloud server, a datacenter server, a server configured to run multiple virtual machines, a video gaming system, a virtual reality system, an augmented reality system, a vehicle, an automated manufacturing system, a process control system, a robotic system, an embedded system.

Some Additional Combinations and Variations

Examples are provided herein to help illustrate aspects of the technology, but the examples given within this document do not describe all of the possible embodiments. Embodiments are not limited to the specific implementations, arrangements, sequences, flows, features, approaches, or scenarios provided herein. A given embodiment may include additional or different technical features, mechanisms, or physical structures, for instance, and may otherwise depart from the examples provided herein.

Any of the combinations of materials, locations, orientations, positionings, support structures, logic, components, communications, connections, and their functional equivalents described herein may also be combined with any of the systems, devices, methods and their variations described herein. A method may include any steps described herein in any subset or combination or sequence which is operable. Each variant may occur alone, or in combination with any one or more of the other variants. Each variant may occur with any of the described methods and each method practiced may be combined with any one or more of the other methods described. Each method or combination of methods, including variants, may be utilized with any of the device combinations and variants described above when such combination is operable.

Some embodiments use or provide a cooling device 128 for fluid submersion of electronics, with the device including at least a coolant container 102 which encloses at least a portion of a coolant space 126. A connection block 112 is mechanically attachable to the coolant container. This connection block 112 has a coolant-space-facing surface 114 and an environment-facing surface 116. This connection block also has an internal electronics connector 302 on the coolant-space-facing surface, and has an external electronics connector 118 on the environment-facing surface which is electrically connected to the internal electronics connector.

The external electronics connector 118 may be implemented with connectors 510, 514; the environment-facing surface 116 is not necessarily planar and does not necessarily consist of only a single face of the connection block.

In these embodiments, a coolant input 120 has a valved inlet to the coolant space, and a coolant output 122 has a valved outlet from the coolant space. These embodiments also include a closure 110 which is operable to seal a volume of a coolant 406 and an electronics device 104 in the coolant space inside the coolant container. At least a portion of the electronics device is submerged in the coolant, and the electronics device 104 is mechanically and electrically connected to the internal electronics connector 302.

In some embodiments, the coolant 406 includes a dielectric liquid. Coolants 406 may include perfluorinated carbons, deionized water, tap water in outer coolant spaces like those between containers 1302 and 1304 illustrated in FIG. 13, glycol/water solutions, mineral oils, aliphatic hydrocarbons, silicone oils, and others fluids, depending on the embodiment.

Some embodiments include a cooling device 128 in combination with an electronics device 104, thereby forming a cooled electronics module 100.

In some of the embodiments, constraints are placed to functionally distinguish the present approach from other approaches that involve use of a fluid to provide cooling.

For instance, in some embodiments the electronics device 104 has a motherboard 106 which is the only motherboard that is mechanically and electrically connected to the internal electronics connector and is sealed within the coolant space inside the coolant container. In other situations, by contrast, multiple motherboards are partially or fully immersed in a single shared pool of coolant liquid. A board is considered a "motherboard" when (a) it is the largest circuit board in the electronic device, (b) it is referred to by its manufacturer or vendor as a "motherboard" or as a "backboard" or as a "backplane" or as a "system board", or (c) when it has the connector 124 that plugs into the internal connector 302.

As another constraint example, in some embodiments a "total CEM thermal output" is constrained. The total CEM thermal output is the total thermal output of all electronics devices in the coolant space inside the coolant container during operation of those electronics devices. Assume that thermal output is measured as watts (W) drawn divided by conversion efficiency times 3.41214 to yield British Thermal Units (BTUs) per hour. In some embodiments, the total CEM thermal output is in the range from 1137 BTUs/hour, which corresponds to 300 W at 90% efficiency, to 3412 BTUs/hour, which corresponds to 800 W at 80% efficiency. In some embodiments, the total CEM thermal output is in the range from 1616 BTUs/hour, which corresponds to 450 W at 95% efficiency, to 2986 BTUs/hour, which corresponds to 700 W at 80% efficiency. In some embodiments, the total CEM thermal output is in the range from 2409 BTUs/hour, which corresponds to 600 W at 85% efficiency, to 3211 BTUs/hour, which corresponds to 800 W at 85% efficiency. Round figures may serve as constraints in some embodiments, e.g., the total CEM thermal output may be constrained to the range from 2000 BTUs/hour to 3000 BTUs/hour, or the range from 2200 BTUs/hour to 2800 BTUs/hour, for example. A maximum may also serve alone as a constraint, e.g., in some embodiments the total CEM thermal output is at most 2400 BTUs/hour.

As another constraint example, in some embodiments a rack unit volume (RUV) is defined. Clarity of the RUV definition in use is called for, because different definitions are available herein. For example, in some embodiments 1 RUV is defined as 1.75*19*36 cubic inches, while in others 1 RUV is defined as 1.75*23*36 cubic inches, or as 1.75*19*29 cubic inches, or as 1.75*23*19 cubic inches. Other definitions may also be given, based on physical rack dimensions in a given facility 400. However, the RUV definition used with a CEM does not necessarily correspond to the physical dimensions of a rack that holds the CEM to which the RUV definition is applied. Together with an RUV definition, a constraint may specify a range or a maximum for the amount of RUV within the CEM coolant container. Containers 102 may be flexible, so use of RUV as a measure presumes an average container volume for an operational container in a CEM 100. For instance, in some embodiments the coolant space within the coolant container (including any coolant in the coolant space) has a volume that is in the range from 0.5 RUV to 1.5 RUV, while in some embodiments the CEM coolant container volume is in the range from 0.75 RUV to 1.25 RUV, and in some the CEM coolant container volume is no greater than 1.0 RUV.

Some embodiments use or provide a cooling device 128 in combination with at least one rail 402, and the external electronics connector 118 physically engages with and electrically connects with a rail connector (510, 514, or both) in the rail, thereby providing at least one of the following between the rail and the internal electronics connector: a power connection, a data signal connection.

Some embodiments use or provide a cooling device 128 wherein the coolant container 102 has a single opening 130 when the closure 110 is not sealed. In some of these, and the coolant input 120 and the coolant output 122 provide respective coolant paths through the connection block 112 when the closure 110 is sealed.

Some embodiments use or provide a cooling device 128 wherein the coolant container 102 encloses two coolant spaces, e.g., as in FIG. 13. The two (or more in some cases) coolant spaces are in thermal communication with each other and are not in fluid communication with each other. Each of the coolant spaces has a respective coolant input and coolant output. The same coolant fluid may be used in each coolant space, or different coolant fluids 406 may be used in some or all of the different coolant spaces.

Some embodiments use or provide a cooling device 128 for fluid submersion of electronics, including a coolant bag 102 which encloses at least a portion of a coolant space. A connection block 112 is mechanically attachable to the coolant bag. The connection block has a coolant-space-facing surface 114 and an environment-facing surface 116, an internal electronics connector 302 on the coolant-space-facing surface, and an external electronics connector 118 (which may be implemented with connectors 510, 514), on the environment-facing surface, which is electrically connected to the internal electronics connector. A coolant input 120 provides a coolant input path through the connection block and has a valved 508 inlet to the coolant space. A coolant output provides a coolant output path through the connection block and has a valved 508 outlet from the coolant space. A closure 110 is operable to seal a volume of a coolant and an electronics device 104 in the coolant space inside the coolant bag. In some variations, coolant lines external to the cooling device are valved, and the cooling device itself does not necessarily include valves.

Some embodiments include a vane 1000 positioned to direct coolant flow within the coolant bag. The vane is directly or indirectly secured to at least one of the following: the coolant bag, the electronics device.

In some embodiments, the cooling device 128 has at least one extension 602. In some cases, an extension 602 has an offset shape that is configured to mate with a corresponding offset portion of a rail 402. In some cases, the offset shape includes at least one of the following: at least a portion of the coolant input, at least a portion of the coolant output, at least a portion of the external electronics connector.

In some embodiments, the closure 110 includes a unitary mechanical sealing ring, e.g., as in FIG. 1, which is configured to engage with a portion of the connection block and thereby clamp a perimeter of the coolant bag in place between the mechanical sealing ring and the connection block. In some embodiments, the closure 110 includes a multi-piece clamp, e.g., as in FIG. 8, having pieces which are configured to engage with one another and to collectively engage with a portion of the connection block and thereby clamp a perimeter of the coolant bag in place between the multi-piece clamp and the connection block. FIG. 11 shows an example of a flexible container bag 102 clamped between a closure 110 and a connection block 112.

Some embodiments include a cooling device 128 in combination with a rail 402. This rail has at least a coolant supply such as a supply line version of coolant line 504, a separate coolant return such as a return line version of coolant line 504, and a power connector such as connector 514. The rail 402 may also have a signal line and signal connector, in some cases. The coolant input is in detachable fluid communication with the coolant supply, the coolant output is in detachable fluid communication with the coolant return, and the external electronics connector is in electrical connection with the power connector.

Turning now to some method examples, in some embodiments a cooling device installation method includes an operational step of obtaining 1402 a cooling device. The obtained cooling device includes a coolant container that encloses at least a portion of a coolant space and at least a portion of an electronics device. The cooling device also includes a connection block that is mechanically attachable to the coolant container. The connection block has a coolant-space-facing surface and an environment-facing surface, and on the environment-facing surface has an external electronics connector which is electrically connected to the electronics device. The cooling device also includes a coolant input with a valved inlet to the coolant space and a coolant output with a valved outlet from the coolant space.

This installation method also includes an operational step of placing 1404 the cooling device connection block on at least one rail, and an operational step of connecting 1406 at least one of the following to the external electronics connector: a power connector, a data signal connector.

This installation method also includes an operational step of putting 1408 coolant into the coolant space until the electronics device is substantially submerged 1410 in the coolant, and closing 1412 the coolant container, thereby separating 1414 the coolant space from an environment around the cooling device.

In some embodiments, such a cooling device installation method is suitable for initial deployment of electronic devices, in that placing 1404 the cooling device connection block on at least one rail occurs before putting 1408 coolant into the coolant space.

In some embodiments, such a cooling device installation method is suitable for rapid replacement of a previously deployed electronic device, in that putting 1408 coolant into the coolant space and then closing 1412 the coolant container occurs before placing 1404 the cooling device connection block on at least one rail.

In some cooling device installation method embodiments, an action placing 1404 the cooling device connection block on at least one rail also connects 1406 the external electronics connector to a power connector or a data signal connector or both. That is, the placing 1404 and connecting 1406 operations are accomplished in a single physical action performed 1902 by an installer. The installer may be robotic, or be a human technician, for example. Similarly, in some cooling device installation method embodiments, a single performed 1902 action places 1404 the cooling device connection block on at least one rail and also engages 1416 the coolant input to a coolant supply and also engages 1416 the coolant output to a coolant return.

In some cooling device installation method embodiments, placing 1404 the cooling device connection block places the coolant container in a vertical orientation, e.g., as in FIG. 4, with the coolant container hanging from the at least one rail, and with the connection block located above at least ninety percent of the coolant space after closing the coolant container.

CONCLUSION

Although particular embodiments are expressly illustrated and described herein as methods or as devices (i.e., articles of manufacture or systems), it will be appreciated that discussion of one type of embodiment also generally extends to other embodiment types. For instance, the descriptions of methods in connection with FIGS. 14-19 also help describe devices like those discussed in connection with FIGS. 1-13, and vice versa. It does not follow that limitations from one embodiment are necessarily read into another. In particular, methods are not necessarily limited to the components and component arrangements presented while discussing FIGS. 1-13.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "method, system, article of manufacture, or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated or implemented differently, or be a mix of effects or features appearing in two or more of the examples. Functionality shown at one location may also be provided at a different location in some embodiments; one of skill recognizes that functional components can be defined in various ways in a given implementation without necessarily omitting desired technical effects from the collection of interacting and connected components viewed as a whole.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used.

As used herein, terms such as "a" and "the" are inclusive of one or more of the indicated item or step. In particular, in the claims a reference to an item generally means at least one such item is present and a reference to a step means at least one instance of the step is performed. The term "or" is nonexclusive. Thus, "x or y" means "x or y or both".

Headings are for convenience only; information on a given topic may be found outside the section whose heading indicates that topic.

All claims and the abstract, as filed, are part of the specification.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A cooling device for fluid submersion of electronics, comprising:
    a coolant container which encloses at least a portion of a coolant space;
    a connection block which is mechanically attachable to the coolant container, the connection block having a coolant-space-facing surface and an environment-facing surface, the connection block having an internal electronics connector on the coolant-space-facing surface and having an external electronics connector on the environment-facing surface which is electrically connected to the internal electronics connector;
    a coolant input located on the environment-facing surface, the coolant input having an inlet to the coolant space;
    a coolant output located on the environment-facing surface, the coolant output having an outlet from the coolant space; and
    a closure which is operable to seal a volume of a coolant and at least one electronics device in the coolant space inside the coolant container when at least a portion of the at least one electronics device is submerged in the coolant and when the at least one electronics device is mechanically and electrically connected to the internal electronics connectors;
    wherein the coolant input and the coolant output each physically engage with a respective coolant connector in a rail, thereby providing respective coolant paths between the rail and the coolant space; and
    wherein the external electronics connector physically engages with and electrically connects with at least one rail connector in the rail, thereby providing at least one of the following between the rail and the internal electronics connector: a power connection, or a data signal connection.

2. The cooling device of claim 1, further comprising the coolant, wherein the coolant comprises a dielectric liquid.

3. The cooling device of claim 1, further comprising the at least one electronics device, thereby forming a cooled electronics module.

4. The cooling device of claim 3, wherein the at least one electronics device has a motherboard which is the only motherboard that is mechanically and electrically connected to the internal electronics connector and is sealed within the coolant space inside the coolant container.

5. The cooling device of claim 3, wherein thermal output is measured as watts (W) drawn divided by conversion efficiency times 3.41214 to yield British Thermal Units (BTUs) per hour, and wherein a total thermal output of the at least one electronics device in the coolant space inside the coolant container during operation of the at least one electronics device is in the range from 1137 BTUs/hour, which corresponds to 300 W at 90% efficiency, to 3412 BTUs/hour, which corresponds to 800 W at 80% efficiency.

6. The cooling device of claim 1, wherein a rack unit volume (RUV) is defined as 1.75*19*36 cubic inches, and wherein the coolant space within the coolant container has a volume that is in the range from 0.5 RUV to 1.5 RUV.

7. The cooling device of claim 1, wherein the external electronics connector provides both of the following between the rail and the internal electronics connector: the power connection, and the data signal connection.

8. The cooling device of claim 1, wherein the coolant container has a single opening when the closure is not sealed, and wherein the coolant input and the coolant output provide the respective coolant paths through the connection block when the closure is sealed.

9. The cooling device of claim 1, wherein the cooling space comprises two cooling spaces, the coolant container encloses the two coolant spaces which are in thermal communication with each other and are not in fluid communication with each other, and each of the coolant spaces has a respective one of the coolant input and a respective one of the coolant output, and wherein one of the coolant spaces is at least partially enclosed by another one of the coolant spaces when at least a portion of the at least one electronics device is submerged in the coolant and when the at least one electronics device is mechanically and electrically connected to the internal electronics connector.

10. A cooling device installation method, comprising:
    obtaining a cooling device which includes a coolant container that encloses at least a portion of a coolant space and at least a portion of at least one electronics device, the cooling device also including a connection block that is mechanically attachable to the coolant container, the connection block having a coolant-space-facing surface and an environment-facing surface, the connection block having an internal electronics connector on the coolant-space-facing surface, the connection block having on the environment-facing surface an external electronics connector which is electrically connected to the at least one electronics device when the at least one electronics device is electrically connected to the internal electronics connector, the cooling device also including a coolant input located on the environment-facing surface, the coolant input equipped with a valved inlet to the coolant space, and a coolant output located on the environment-facing surface, the coolant output equipped with a valved outlet from the coolant space;

mechanically attaching the connection block to the coolant container;

providing at least one rail, the at least one rail comprising a coolant supply, a coolant return, and at least one of a power connector or a data signal connector;

placing the connection block on at least one rail, thereby connecting at least one of the following to the external electronics connector: the power connector, or the data signal connector;

putting coolant into the coolant space until the at least one electronics device is substantially submerged in the coolant; and closing the coolant container, thereby separating the coolant space from an environment around the cooling device.

11. The cooling device installation method of claim 10, wherein the method is suitable for an initial deployment in a facility, in that placing the connection block on the at least one rail occurs before putting the coolant into the coolant space.

12. The cooling device installation method of claim 10, wherein the method is suitable for a rapid replacement in a facility, in that putting the coolant into the coolant space and then closing the coolant container occurs before placing the connection block on the at least one rail.

13. The cooling device installation method of claim 10, wherein an action placing the connection block on the at least one rail also connects the external electronics connector to both the power connector and the data signal connector.

14. The cooling device installation method of claim 13, wherein an action placing the connection block on the at least one rail also engages the coolant input to the coolant supply and engages the coolant output to the coolant return.

15. The cooling device installation method of claim 10, wherein placing the connection block places the coolant container in a vertical orientation with the coolant container hanging from the at least one rail, and with the connection block located above at least ninety percent of the coolant space after closing the coolant container.

16. A cooling device for fluid submersion of electronics, comprising:
a coolant bag which encloses at least a portion of a coolant space;
a connection block which is mechanically attachable to the coolant bag, the connection block having a coolant-space-facing surface and an environment-facing surface which has cooling device connectors configured for physical and electric engagement with connectors of a rail, the connection block having an internal electronics connector on the coolant-space-facing surface and having an external electronics connector on the environment-facing surface which is electrically connected to the internal electronics connector, the cooling device connectors comprise a coolant input, a coolant output and the external electronics connector;
the coolant input located on the environment-facing surface, the coolant input providing a coolant input path through the connection block and having a valved inlet to the coolant space;
the coolant output located on the environment-facing surface, the coolant output providing a coolant output path through the connection block and having a valved outlet from the coolant space; and
a closure which is operable to seal a volume of a coolant and at least one electronics device in the coolant space inside the coolant bag when at least a portion of the at least one electronics device is submerged in the coolant and when the at least one electronics device is mechanically and electrically connected to the internal electronics connector.

17. The cooling device of claim 16, further comprising a vane positioned to direct a flow of the coolant within the coolant bag, the vane secured to at least one of the following: the coolant bag, or the at least one electronics device.

18. The cooling device of claim 16, wherein the cooling device has at least one extension which has an offset shape that is configured to mate with a corresponding offset portion of the rail, and the offset shape includes at least one of the following: at least a portion of the coolant input, at least a portion of the coolant output, or at least a portion of the external electronics connector.

19. The cooling device of claim 16, wherein the closure comprises at least one of the following:
a unitary mechanical sealing ring which is configured to engage with a portion of the connection block and thereby clamp a perimeter of the coolant bag in place between the mechanical sealing ring and the connection block; or
a multi-piece clamp having pieces which are configured to engage with one another and to collectively engage with a portion of the connection block and thereby clamp a perimeter of the coolant bag in place between the multi-piece clamp and the connection block.

20. The cooling device of claim 16, the rail having at least a coolant supply, a coolant return, and a power connector, wherein the coolant input is in detachable fluid communication with the coolant supply, the coolant output is in detachable fluid communication with the coolant return, and the external electronics connector is in detachable electrical connection with the power connector.

* * * * *